United States Patent
Arflack

(10) Patent No.: US 11,177,585 B2
(45) Date of Patent: Nov. 16, 2021

(54) INSULATION PIERCING ELECTRICAL TAP CONNECTORS

(71) Applicant: Panduit Corp., Tinley Park, IL (US)

(72) Inventor: Brian K. Arflack, Burr Ridge, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 16/810,228

(22) Filed: Mar. 5, 2020

(65) Prior Publication Data
US 2020/0295472 A1    Sep. 17, 2020

Related U.S. Application Data

(60) Provisional application No. 62/818,912, filed on Mar. 15, 2019.

(51) Int. Cl.
| | | |
|---|---|---|
| *H01R 11/20* | (2006.01) | |
| *H01R 4/2407* | (2018.01) | |
| *G01R 19/00* | (2006.01) | |
| *H01R 4/2408* | (2018.01) | |

(52) U.S. Cl.
CPC ....... *H01R 4/2407* (2018.01); *G01R 19/0084* (2013.01); *H01R 4/2408* (2013.01)

(58) Field of Classification Search
CPC .. H01R 4/2407; H01R 4/2408; H01R 13/502; H01R 43/01; H01R 4/26; H01R 4/42; H01R 4/2433; G01R 19/0084
USPC ......................... 439/395, 411, 412
See application file for complete search history.

(56) References Cited

U.S. PATENT DOCUMENTS

| | | | |
|---|---|---|---|
| 3,602,872 A * | 8/1971 | Braunstein ........... | H01R 4/2406 439/425 |
| 3,688,247 A | 8/1972 | Prodel | |
| 3,848,955 A * | 11/1974 | Lockie ................ | H01R 4/2483 439/416 |
| 3,848,956 A * | 11/1974 | Kraft .................... | H01R 4/2408 439/411 |
| 3,876,729 A | 4/1975 | Mueller | |
| 4,050,761 A * | 9/1977 | De France .......... | H01R 4/2408 439/411 |
| 4,120,554 A * | 10/1978 | Bianchi ................ | H01R 24/542 439/411 |
| 4,237,198 A | 12/1980 | Eby et al. | |
| 4,248,942 A | 2/1981 | Eby et al. | |

(Continued)

FOREIGN PATENT DOCUMENTS

| | | |
|---|---|---|
| DE | 10251287 A1 | 5/2004 |
| EP | 0928044 A1 | 7/1999 |

(Continued)

*Primary Examiner* — Abdullah A Riyami
*Assistant Examiner* — Nelson R. Burgos-Guntin
(74) *Attorney, Agent, or Firm* — Christopher S. Clancy; James H. Williams; Peter S. Lee

(57) ABSTRACT

Various implementations of insulation piercing connectors are disclosed. The insulation piercing connectors include a simple and efficient design for providing electrical tap connections to a power cable for voltage detection purposes. The insulation piercing connector includes at least a top housing and a bottom housing that come together to receive the power cable. Terminal contacts are housed internally within the insulation piercing connector, and the terminal contacts are positioned to pierce the power cable when the insulation piercing connector is assembled into an operational state.

11 Claims, 27 Drawing Sheets

(56) References Cited

U.S. PATENT DOCUMENTS

| | | | | |
|---|---|---|---|---|
| 4,738,009 A * | 4/1988 | Down | H01R 9/0509 | |
| | | | 29/33 M | |
| 4,878,855 A * | 11/1989 | Heng | H01R 4/2408 | |
| | | | 439/411 | |
| 5,102,347 A | 4/1992 | Cote et al. | | |
| 5,203,716 A | 4/1993 | Martucci et al. | | |
| 5,453,021 A * | 9/1995 | Smith | H01R 4/2433 | |
| | | | 439/395 | |
| 5,548,523 A | 8/1996 | Wehrli, III et al. | | |
| 6,099,344 A | 8/2000 | Chadbourne | | |
| 6,106,323 A | 8/2000 | Elisei et al. | | |
| 6,116,931 A | 9/2000 | McCleerey et al. | | |
| 6,165,004 A * | 12/2000 | Robinson | H01R 4/2408 | |
| | | | 439/411 | |
| 6,604,956 B2 | 8/2003 | Ruiz et al. | | |
| 7,059,890 B2 | 6/2006 | Donhauser | | |
| 7,090,544 B2 | 8/2006 | Campbell et al. | | |
| 8,025,521 B2 | 9/2011 | Diniz et al. | | |
| 8,444,431 B1 * | 5/2013 | La Salvia | H01R 4/2408 | |
| | | | 439/404 | |
| 8,784,128 B2 | 7/2014 | Cawood et al. | | |
| 9,287,673 B2 * | 3/2016 | Galla | H01R 9/031 | |
| 9,431,732 B1 * | 8/2016 | Baldwin | H01R 13/5829 | |
| 9,500,684 B1 | 11/2016 | Pendergrass et al. | | |
| 9,768,528 B2 | 9/2017 | Lucantonio | | |
| 10,541,478 B1 * | 1/2020 | King, Jr. | H01R 4/2433 | |
| 10,727,613 B2 * | 7/2020 | Kruzel | H01R 4/2408 | |
| 10,770,832 B2 * | 9/2020 | Franke | H02G 15/115 | |
| 10,950,955 B2 * | 3/2021 | Martin | H01R 4/2408 | |
| 2015/0162670 A1 * | 6/2015 | Galla | H01R 43/01 | |
| | | | 29/872 | |
| 2015/0364839 A1 * | 12/2015 | Keswani | B21F 15/06 | |
| | | | 439/416 | |
| 2018/0269599 A1 | 9/2018 | Garcia Pichardo | | |
| 2019/0148844 A1 * | 5/2019 | Kruzel | H01R 13/6683 | |
| | | | 439/391 | |
| 2019/0245280 A1 | 8/2019 | Parsons et al. | | |
| 2019/0260142 A1 | 8/2019 | Ruggiero | | |

FOREIGN PATENT DOCUMENTS

| | | |
|---|---|---|
| EP | 2871720 A1 | 5/2015 |
| EP | 2882040 A1 | 6/2015 |
| GB | 888213 A | 1/1962 |
| WO | 2018089392 A1 | 5/2018 |

* cited by examiner

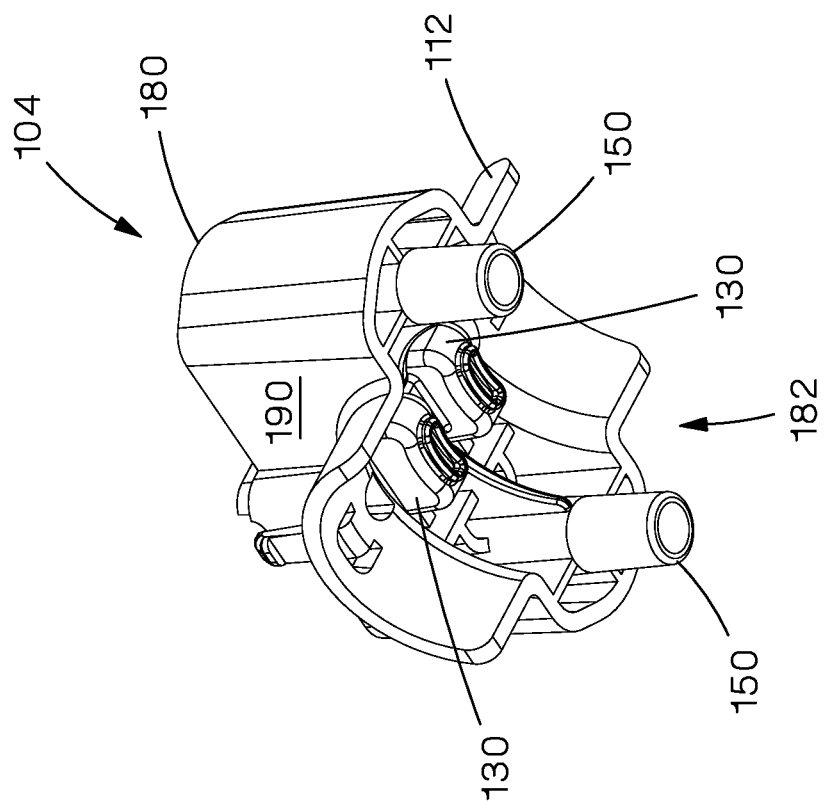
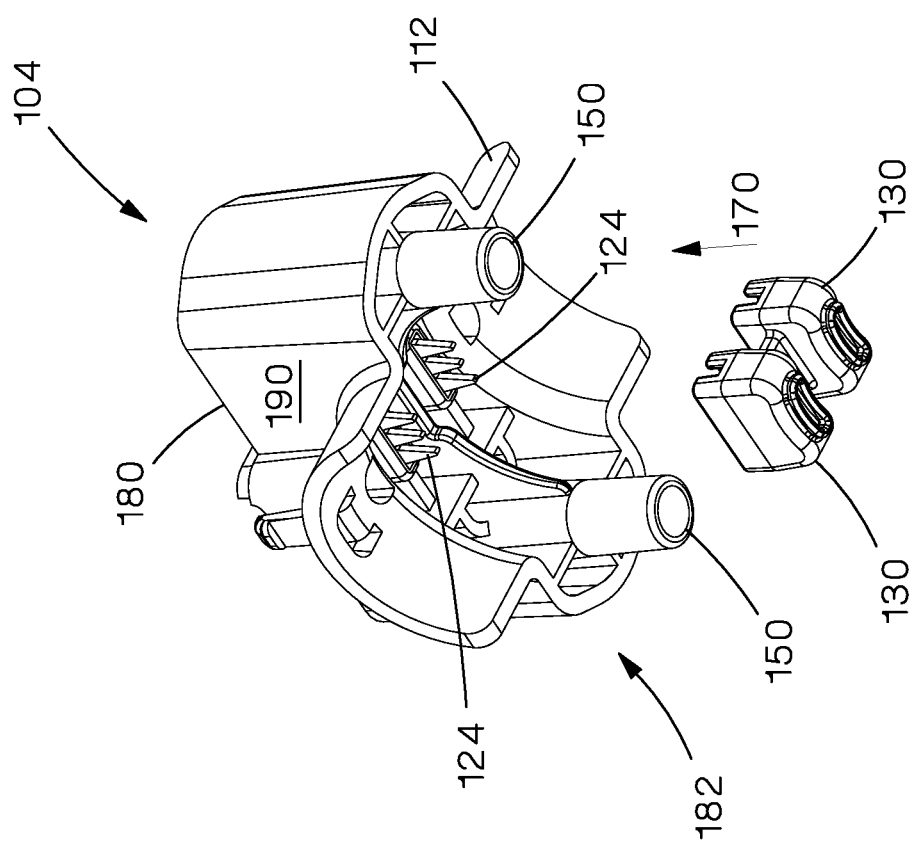
FIG.5B
FIG.5A

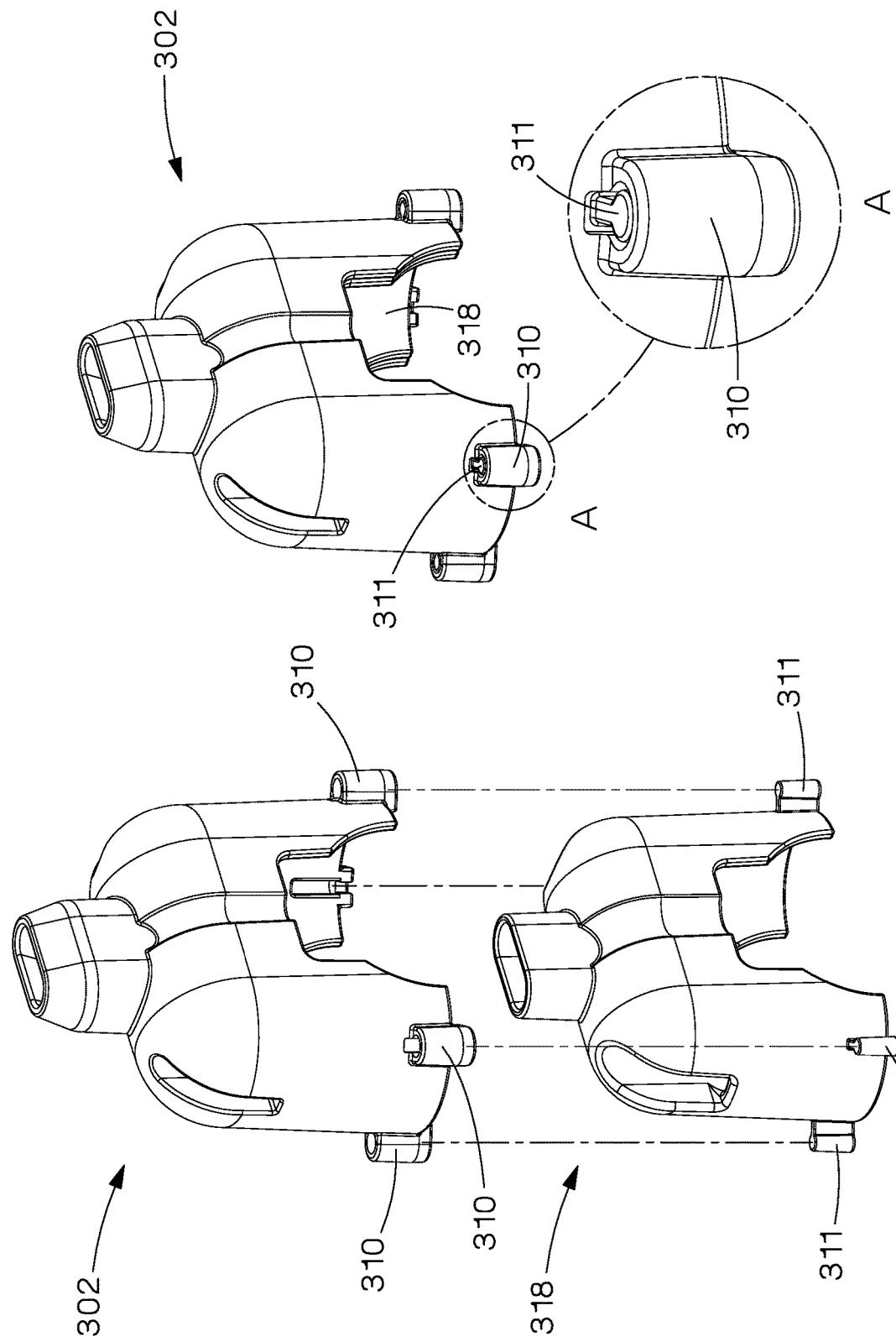

INSULATION PIERCING ELECTRICAL TAP CONNECTORS

CROSS-REFERENCE TO RELATED APPLICATION(S)

This application claims benefit to U.S. Provisional Patent Application No. 62/818,912, filed on Mar. 15, 2019, the entirety of which is hereby incorporated by reference herein.

BACKGROUND

Insulation piercing electrical tap connectors may be used to attach sensing conductors, also known as tap wires, to a power cable. Some voltage detection devices (e.g., some Absence of Voltage Tester (AVT) products) may use dual independent electrical tap connections to each phase of a power cable to perform voltage detection. Voltage detection devices may be mounted inside of a control panel. Applications exist within various industries that may benefit from permanent installation of voltage detection devices.

SUMMARY

The present disclosure describes insulation piercing connectors. An exemplary insulation piercing connector according to an embodiment includes a tap wire housing, a top housing, a contact and an inner insulator. The contact may be located within the top housing, and the inner insulator may surround a first end of the contact. When assembled, the top housing and the tap wire housing may be removably connected, and the top housing and bottom housing may form a central aperture.

An exemplary method of installing an insulation piercing connector according to an embodiment includes inserting a tap wire into a terminal housing of an insulation piercing assembly, inserting a phase wire between a top housing and bottom housing, and compressing the top housing and the bottom housing, where a blade of the insulation piercing assembly contacts the phase wire.

BRIEF DESCRIPTION OF THE DRAWINGS

The following detailed description references the drawings, wherein:

FIG. 5A shows an enlarged view of a portion of the insulation piercing connector shown in FIG. 1;

FIG. 5B shows another enlarged view of a portion of the insulation piercing connector shown in FIG. 5A;

FIG. 18A shows an exploded view of a portion of the insulation piercing connector shown in FIG. 13;

FIG. 18B shows a view of the portion of the insulation piercing connector shown in FIG. 18A and an enlarged portion corresponding to an attachment component in an assembled state;

DETAILED DESCRIPTION

Permanent installation of Absence of Voltage Tester (AVT) products in a cabinet may often be simplified by using electrical tap connectors for permanent connection of AVT tap wires. These AVT products may be used to sense the voltage of a variety of wires or power cables having a variety of different sizes. Additionally, more than one wire in each cabinet may need to be tested/sensed. Thus, the installation of multiple electrical tap connectors in a single cabinet creates an over-crowded and cramped space that can make the cabinet a more difficult workspace. For example, this may require an electrician or other personnel to manipulate the position, angle, or location of the multiple electrical tap connectors, tap wires, or phase wires (power cables) within the cabinet.

The disclosed insulation piercing connectors are designed for use in electrical cabinets, or other appropriate applications, and addresses this cramped cabinet environment by offering a smaller footprint and a configuration adapted to fit well within the cabinet environment. Additionally, the disclosed insulation piercing connectors are provided to address a wider range of wire gauge sizes so end-users may have a consistent design aesthetic and installation methodology regardless of wire size.

The disclosed insulation piercing connector solves or improves upon one or more of the above noted problems and disadvantages. The disclosed insulation piercing connector provides a system for sensing voltage in a compact configuration connectable in or out of a control panel. Embodiments of the present disclosure illustrate an insulation-piercing electrical tap connector that may provide a consistent design aesthetic and installation methodology for a wider range of wire gauge sizes.

These and other objects, features, and advantages of the present disclosure will become apparent to those having ordinary skill in the art upon reading this disclosure.

FIGS. 1-11 show illustrations of an insulation piercing connector 100 according to an embodiment of the present disclosure. The insulation piercing connector 100 is configured to provide dual independent electrical tap connections between a voltage detection device (not shown) and a cable (e.g., a power cable or phase wire).

Figure 1:
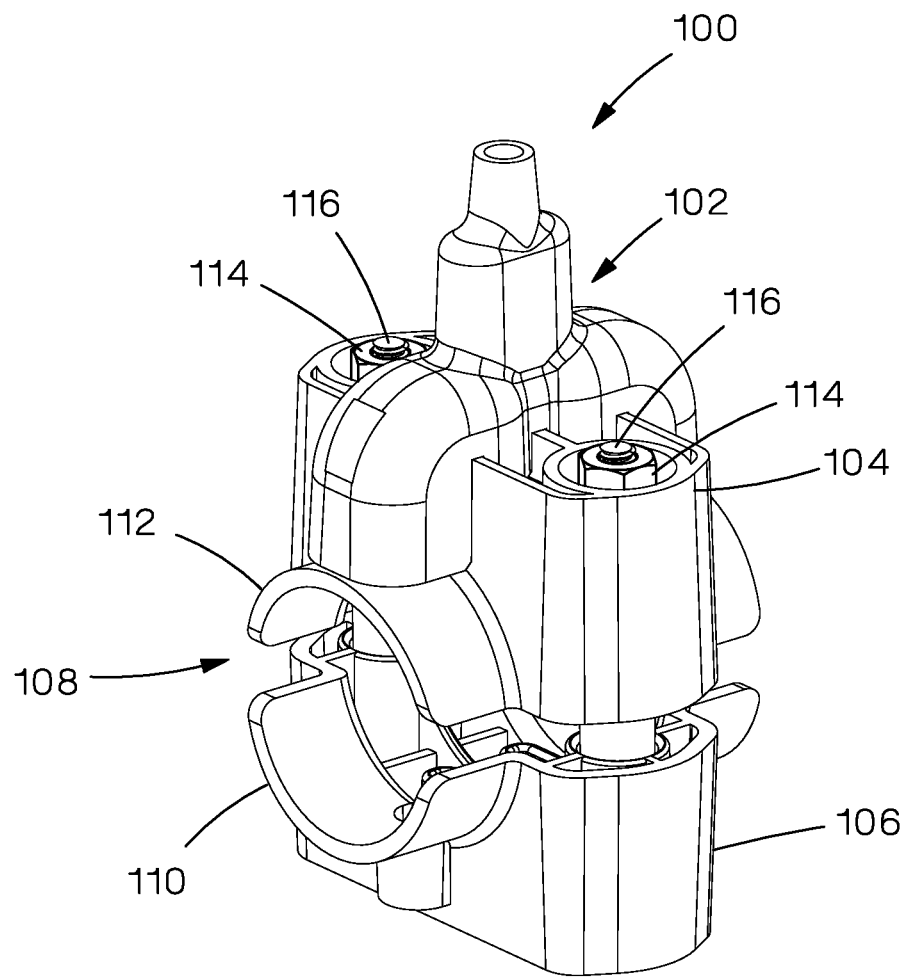
FIG. 1 shows an insulation piercing connector according to an embodiment of the present disclosure.

As seen in FIG. 1, the insulation piercing connector 100 is shown in an exemplary assembled configuration that is ready for receipt by a customer. The insulation piercing connector 100 includes a top housing 104, a bottom housing 106, an outer insulator 102, nuts 114, and bolts 116. The nuts 114 may be hex nuts, or any other suitable fastener. The bolts 116 may be screws, carriage bolts, or any other suitable fastener. In the embodiment, a top portion of the bottom housing 106 includes first concave portions 110 forming concave-down semi-circles on opposite faces of the bottom housing 106. Second concave portions 112 are located on a bottom portion of the top housing 104, forming concave-up semi-circles on opposite faces of the top housing 104. The first concave portions 110 and the second concave portions 112 define a central aperture 108 through the insulation piercing connector 100 for receiving a cable. In an embodiment, the insulation piercing connector 100 may include first concave portions 110 and second concave portions 112 on both a front face and a rear face of the insulation piercing connector 100 that are opposite each other. In an alternate embodiment, the insulation piercing connector 100 may include first concave portions 110 and second concave portions 112 on only one of a front face or a rear face of the insulation piercing connector 100.

In the embodiment, the outer insulator 102 may be made of rubber or other elastomer material. In an alternate embodiment, the outer insulator 102 may be made of any other suitable non-conductive material. The top housing 104 and the bottom housing 106 may be constructed of the same or similar polymers/plastics. In an alternate embodiment, the top housing 104 and the bottom housing 106 may be constructed from different materials, where the different materials may be non-conducting materials. In one example, top housing 104 and bottom housing 106 may be made of a glass-filled nylon polymer.

Figure 2:
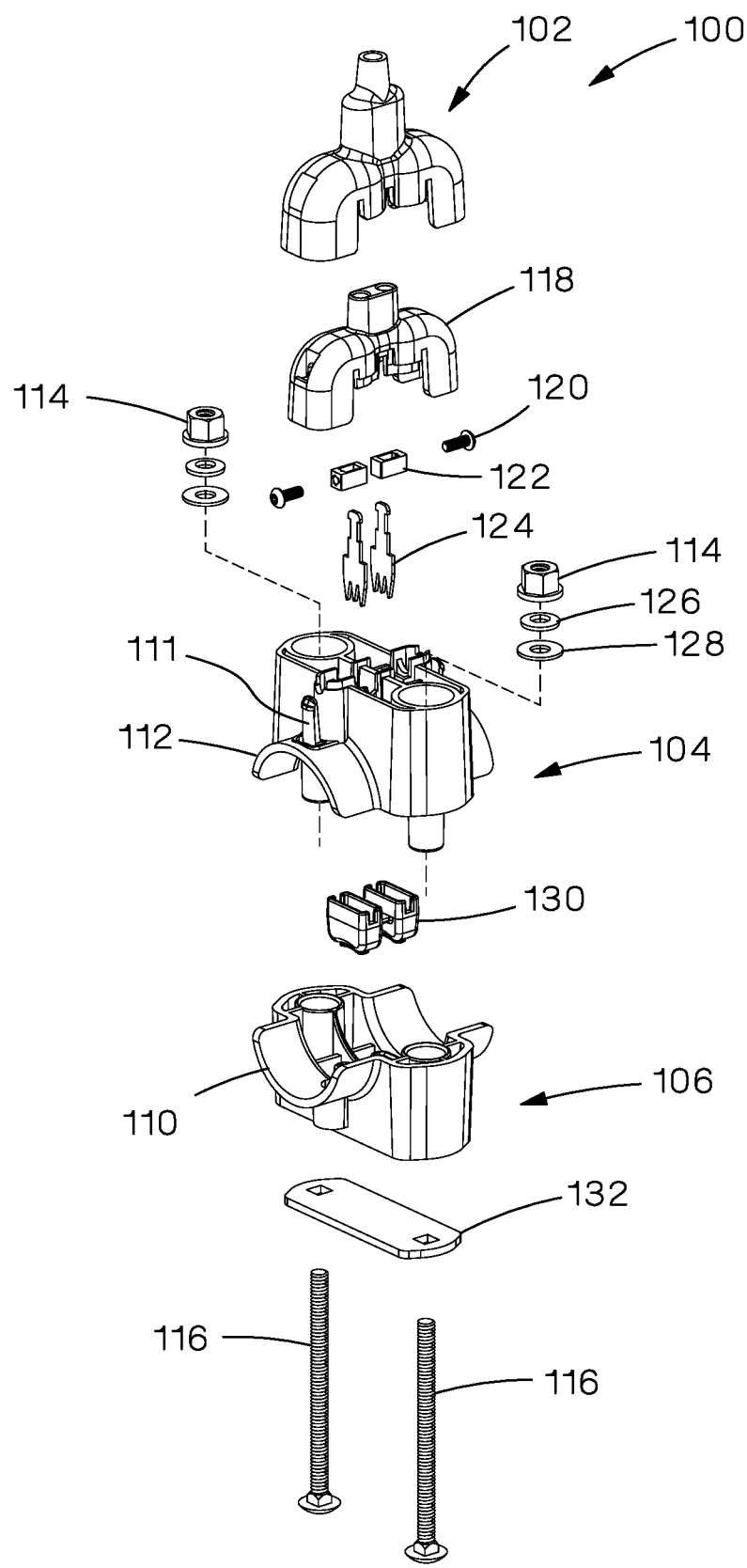
FIG. 2 shows an exploded view of the insulation piercing connector shown in FIG. 1.
Figure 3:
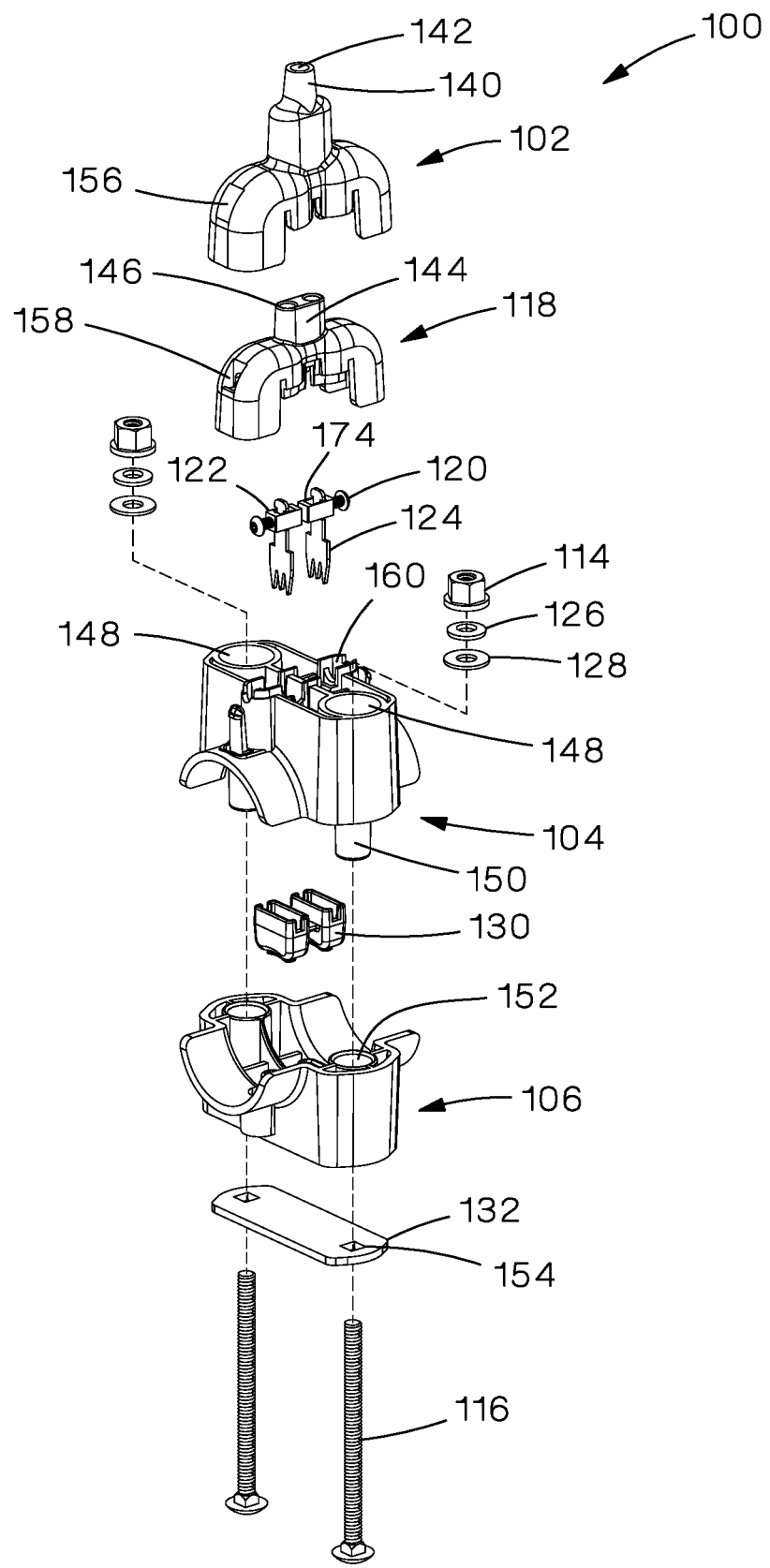
FIG. 3 shows an exploded view of the insulation piercing connector shown in FIG. 1 according to another assembled state.
Figure 4:
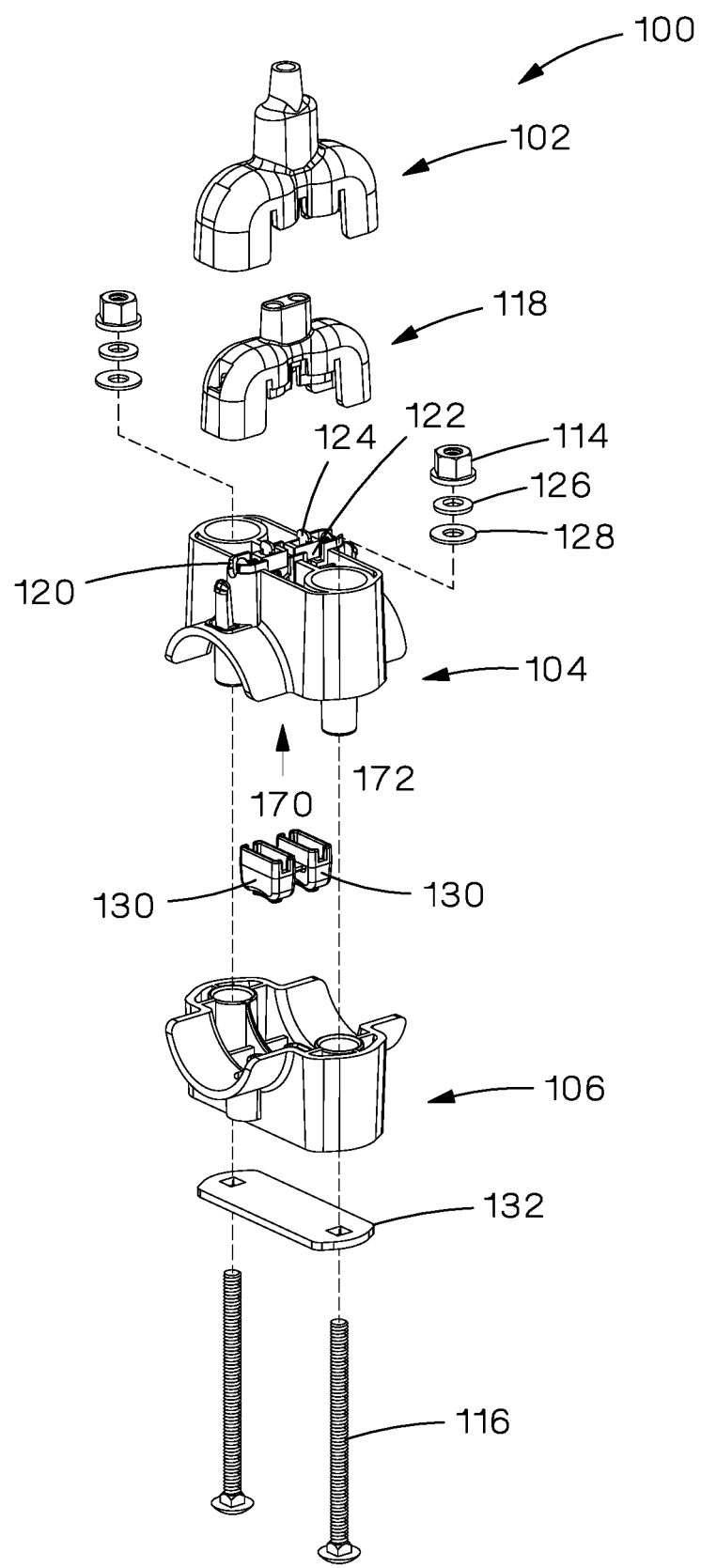
FIG. 4 shows an exploded view of the insulation piercing connector shown in FIG. 1 according to another assembled state.

FIGS. 2-4 show exploded views of the insulation piercing connector 100 during various states of assembly. FIG. 2 shows the insulation piercing connector 100 in an exploded view to show components spaced apart, such as before any assembly may have occurred. In addition to the features described above in FIG. 1, the insulation piercing connector 100 additionally includes a tap wire housing 118, terminal adjustment screws 120, terminal housings 122, stamped contacts 124, spring washers 126, flat washers 128, inner insulators 130, and support plate 132. The inner insulators 130 may be made of rubber or other elastomer material, or alternatively, any suitable non-conducting material. The terminal adjustment screws 120 may be any screw, bolt, or other type of fastener. Additionally, although depicted as spring washers 126 and flat washers 128, spring washers 126 and flat washers 128 may be any type of suitable washer according to other embodiments.

According to an exemplary method of assembly, the stamped contacts 124 may move upward through the bottom of the top housing 104 within channels (not shown) formed inside the top housing 104. The terminal housings 122 may move downward into the top of top housing 104 to meet shoulders of the stamped contacts 124. The terminal adjustment screws 120 may secure the terminal housings 122 with the stamped contacts 124 when positioned in top housing 104.

Figure 6:
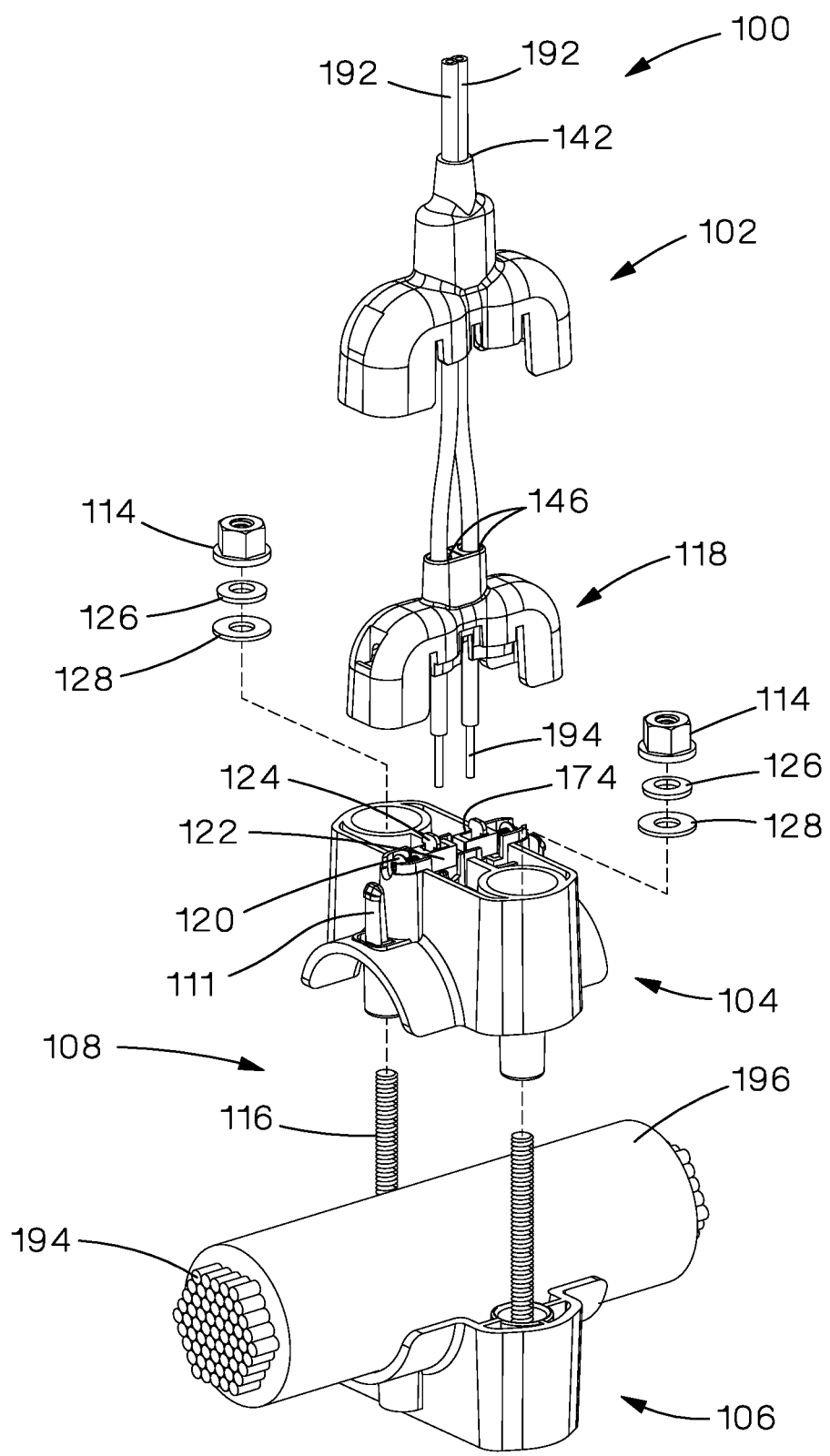
FIG. 6 shows the insulation piercing connector in FIG. 1 and further including exemplary tap wires and a power cable.

FIG. 3 shows the terminal adjustment screws 120, the terminal housings 122, and the stamped contacts 124 assembled together to form a three-piece insulation piercing assembly. In the example embodiment, the insulation piercing assembly is depicted outside of the top housing 104 for ease of understanding and viewing, however, the insulation piercing assembly of the insulation piercing connector 100 is configured to be housed within the top housing 104 when in the assembled state. Accordingly, while the stamped contacts 124 are within the top housing 104, to assemble the insulation piercing assembly the terminal housings 122 are moved downward onto the stamped contacts 124. Next, the terminal adjustment screws 120 are positioned into the terminal housings 122. Once assembled, the insulation piercing assembly includes a space 174 (as shown in FIG. 6) between an inner-most wall of the terminal housing 122 and the stamped contacts 124 where tap wires 192 are inserted to form an electrical connection between the stamped contacts 124 and the voltage sensing device (not shown). The stamped contacts 124 may be made from a metal alloy.

Also shown in FIG. 3, the outer insulator 102 includes a top portion 140 having an opening 142 through which the tap wires 192 are received. In an alternate embodiment, top portion 140 may include more than or less than one opening 142. The outer insulator 102 additionally includes a first window 156 on a first side of the outer insulator 102, and a second window (not shown) mirrored on a second side of the outer insulator 102. The first window 156 and the second window are openings on the outer insulator 102. According to some embodiments, the outer insulator 102 may not include one, or both, of the first window 156 or the second window.

The exemplary tap wire housing 118 additionally includes a first window 158 on a first side of the tap wire housing 118 and a second window (not shown) mirrored on a second side of the tap wire housing 118. The first window 158 and the second window are openings on the tap wire housing 118. According to some embodiments, the tap wire housing 118 may not include one, or both, of the first window 158 or the second window.

The tap wire housing 118 also includes a top portion 144 having two apertures 146. In an alternate embodiment, the top portion 144 may include more than or less than two apertures 146. The two apertures 146 and the opening 142 may be for the insertion of wires or cables through the example insulation piercing connector 100.

Exemplary top housing 104 includes seated portions 160 where the terminal adjustment screws 120 and terminal housings 122 of the insulation piercing assembly abut and rest on when placed into the top housing 104. The seated portions 160 may be recess features within the top housing 104. The stamped contacts 124 extend upward through channels within the body of the top housing 104 to have the shoulders of the stamped contacts 124 reach the seated portions 160 to interact with the terminal housings 122 and terminal adjustment screws 120 when the terminal housings 122 are placed into the top housing 104. The top housing 104 additionally includes openings 148 and corresponding cylindrical extensions 150, and the bottom housing 106 includes openings 152 for receiving the cylindrical extensions 150. The bolts 116 are provided to be inserted and extend through the openings 152 when the insulation piercing connector 100 is further assembled. Although not expressly depicted, cylindrical extensions 150 may optionally internally include threads to engage with the threaded portion of bolts 116.

Support plate 132 includes cut outs 154 for allowing the bolts 116 to extend through. The cut outs 154 are depicted in FIG. 3 as having a square shape because the bolts 116 may optionally include square shanks. However, the cut outs 154 may be any shape for allowing the bolts 116 to extend through. The support plate 132 may be made from metal stamping.

FIG. 4 shows the insulation piercing connector 100 in an assembly state where the insulation piercing assembly is positioned to be housed within the top housing 104. In FIG. 4, the stamped contacts 124 are only partially visible as the stamped contacts 124 are housed within the top housing 104. The terminal adjustment screws 120 may contact the stamped contacts 124 and adjust the relative position of the terminal housings 122. According to an installation example, during installation an electrician may apply a torque using a tool, such as a screwdriver, on the terminal adjustment screws 120. This torque may thereby apply pressure on tap wires 192 (shown in FIG. 7) being compressed between one face or wall of the terminal housing 122 and one face of the stamped contact 124 (within spaces 174), until a specified torque value is achieved.

Additionally, FIG. 4 illustrates a directional arrow 170 representing the movement of the inner insulators 130 upward towards the inside of the top housing 104 to partially or fully surround the tines/blades of the stamped contacts 124. The dashed lines 172 represent the interconnection of elements 114, 126, 128, 132, and 116 with respect to the other features of insulation piercing connector 100.

FIGS. 5A and 5B illustrate views looking up into a bottom-side of the top housing 104. The top housing 104 includes a top portion 180 and a bottom portion 182, as well as a front face 190 and a back face (not shown) that is opposite to the front face 190. The top housing 104 further includes cylindrical extensions 150 and a second concave portion 112 on both the front face 190 and the back face (not shown). FIG. 5A shows the uncovered tines or blades of stamped contacts 124, where the directional arrow 170 indicates the direction of movement of the inner insulators 130 for them to be installed within the top housing 104. FIG. 5B shows, in the example embodiment, the inner insulators 130 in an installed state where the inner insulators are positioned to cover over the blades of the stamped contacts 124. The inner insulators 130 may be U-shaped and include an opening at the top to surround the stamped contacts 124. In an alternate embodiment, the inner insulators 130 may take on one of a variety of different shapes including semi-circular, rectangular, etc. In an alternate embodiment, the stamped contacts 124 and the inner insulators 130 may be positioned into the top housing 104 from the top or sides of the top housing 104.

Figure 7:
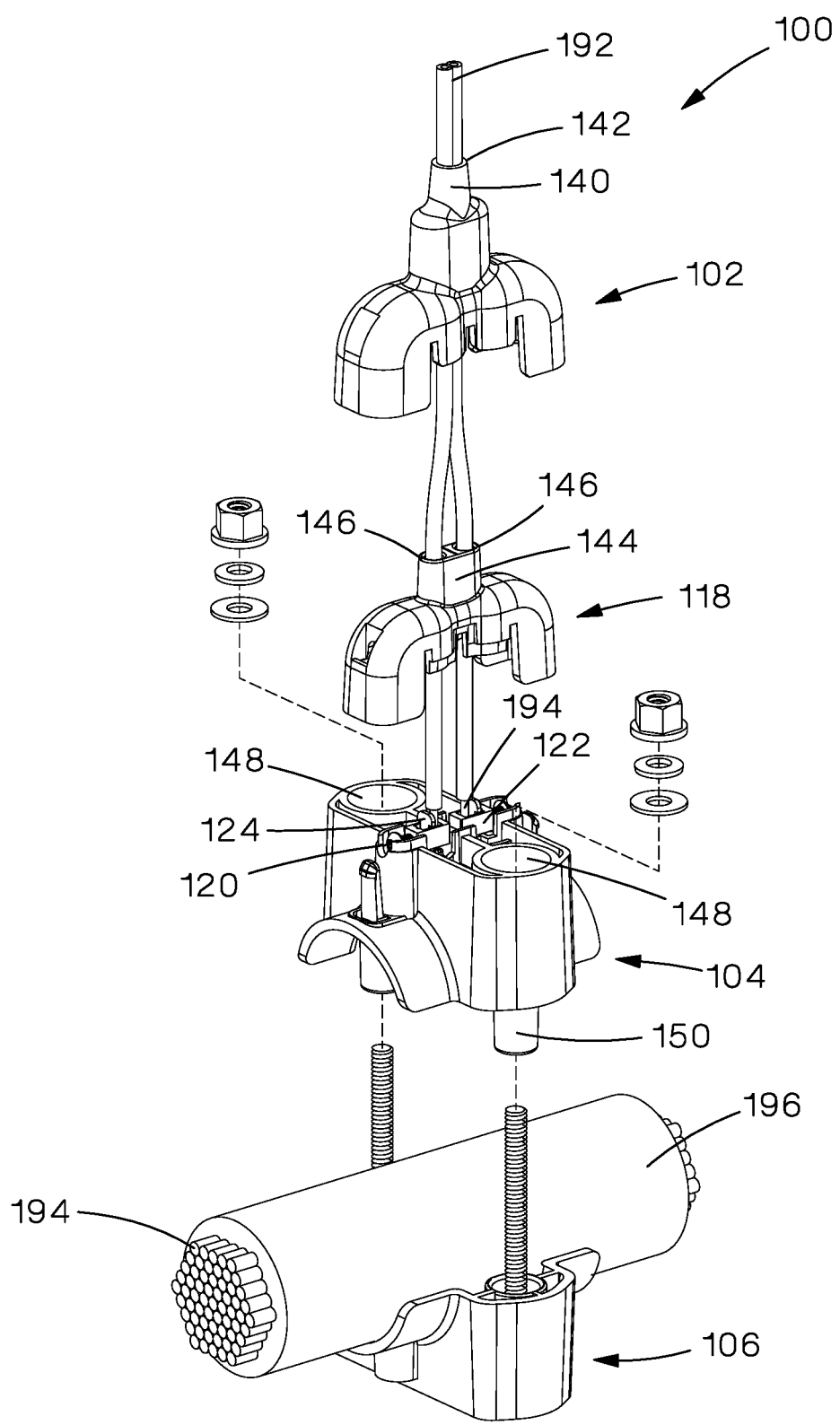
FIG. 7 shows an exploded view of the insulation piercing connector shown in FIG. 6 according to another assembled state.

FIGS. 6-11 show the insulation piercing connector 100 further including tap wires 192 and the power cable or phase wire 196 during various stages of assembly, according to some embodiments. In FIG. 6, tap wires 192 are inserted through the opening 142 of the outer insulator 102 and subsequently moved through apertures 146 of the tap wire housing 118, toward the central aperture 108. According to the embodiments relating to FIG. 6, the tap wires 192 are inserted vertically downwards through the insulation piercing connector 100. An exterior sleeve or outer insulating casing of the tap wires 192 may be stripped off to expose the inner conductor 194 of the tap wires 192, as shown by the exposed ends of the tap wires 192 shown in FIG. 6. In an alternate embodiment, the tap wires 192 may have been manufactured to include the exposed ends showing the inner conductor 194. In FIG. 7, the inner conductor 194 at the exposed ends of the tap wires 192 are inserted into the spaces 174 between the wall of the terminal housings 122 and the face of the stamped contacts 124.

According to the embodiments illustrated by FIG. 6, the phase wire 196 is positioned in the central aperture 108. The phase wire 196 may be positioned perpendicular to the tap wires 192, or according to an alternate embodiment, the phase wire 196 may be placed in the central aperture 108 at a later point in assembly of the insulation piercing connector 100.

FIGS. 6 and 7 show the tap wire housing 118 and the top housing 104 as receiving tap wires 192 prior to tap wire housing 118 being installed onto top housing 104. During the assembly process, the tap wire housing 118 may be assembled onto top housing 104 prior to the inclusion of tap wires 192. Therefore, the tap wire housing 118 may have a transparent, opaque or semi-transparent quality, and the tap wire housing 118 may be made from polycarbonate materials, or any other suitable polymer or non-conducting material. This quality may aid an electrician's assembly of the insulation piercing connector 100 by allowing the electrician to see when tap wires 192 are appropriately situated within tap wire housing 118 and top housing 104. In an alternate embodiment, the tap wire housing 118 and top housing 104 may receive the tap wires 192 prior to the attachment of the tap wire housing 118 onto top housing 104.

Figure 8:
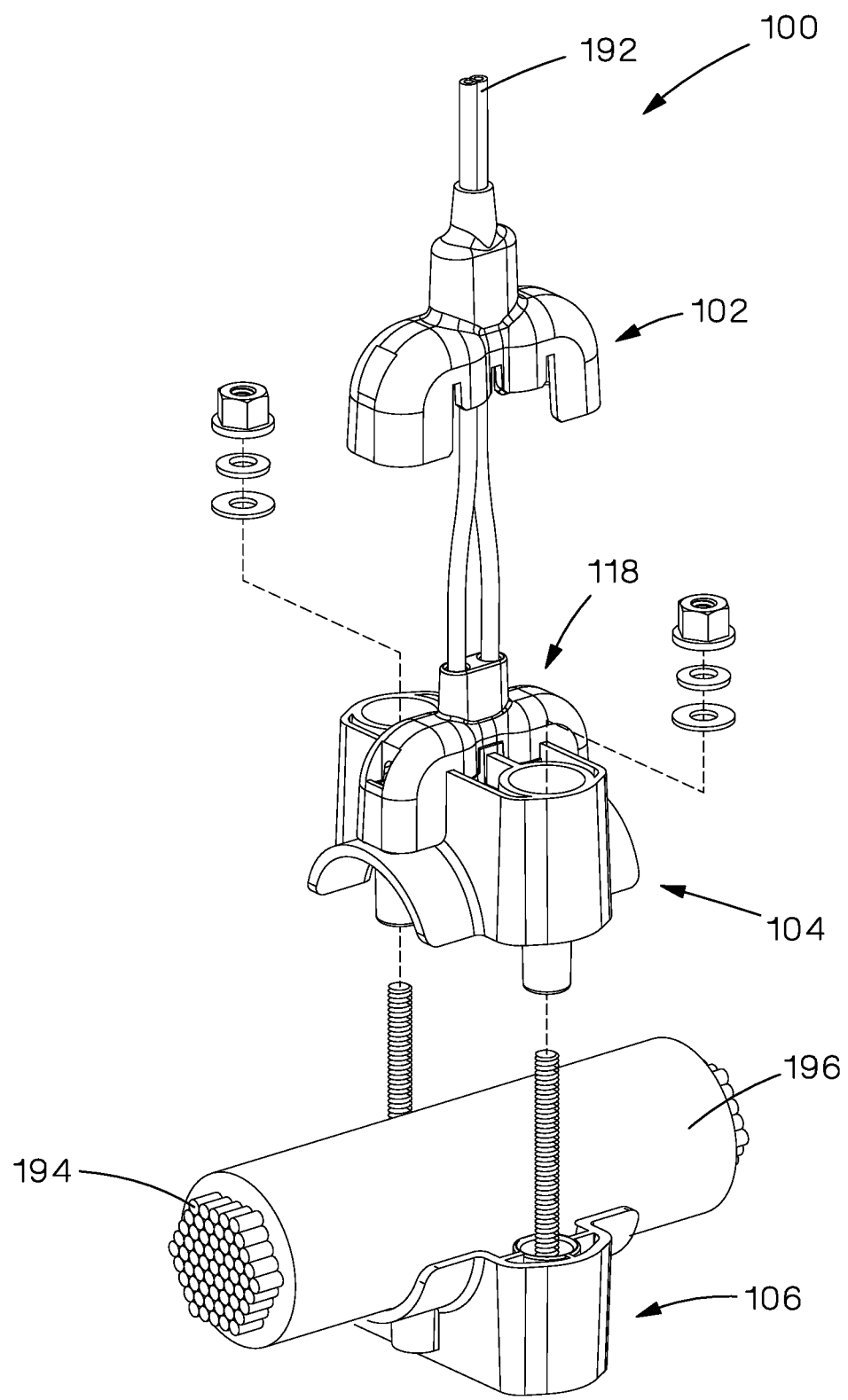
FIG. 8 shows an exploded view of the insulation piercing connector shown in FIG. 6 according to another assembled state.

According to the insulation piercing connector 100 shown in FIG. 8, the tap wire housing 118 is positioned onto top housing 104 with tap wires 192 properly installed within the insulation piercing connector 100. According to some embodiments, the top housing 104 may have a cantilever snap-fit feature 111 that engages into one or more recesses on the tap wire housing 118 (e.g., the first window 158 and/or the second window). In an alternate embodiment, the tap wire housing 118 may form a connection with top housing 104 via any appropriate securing mechanism.

Figure 9:
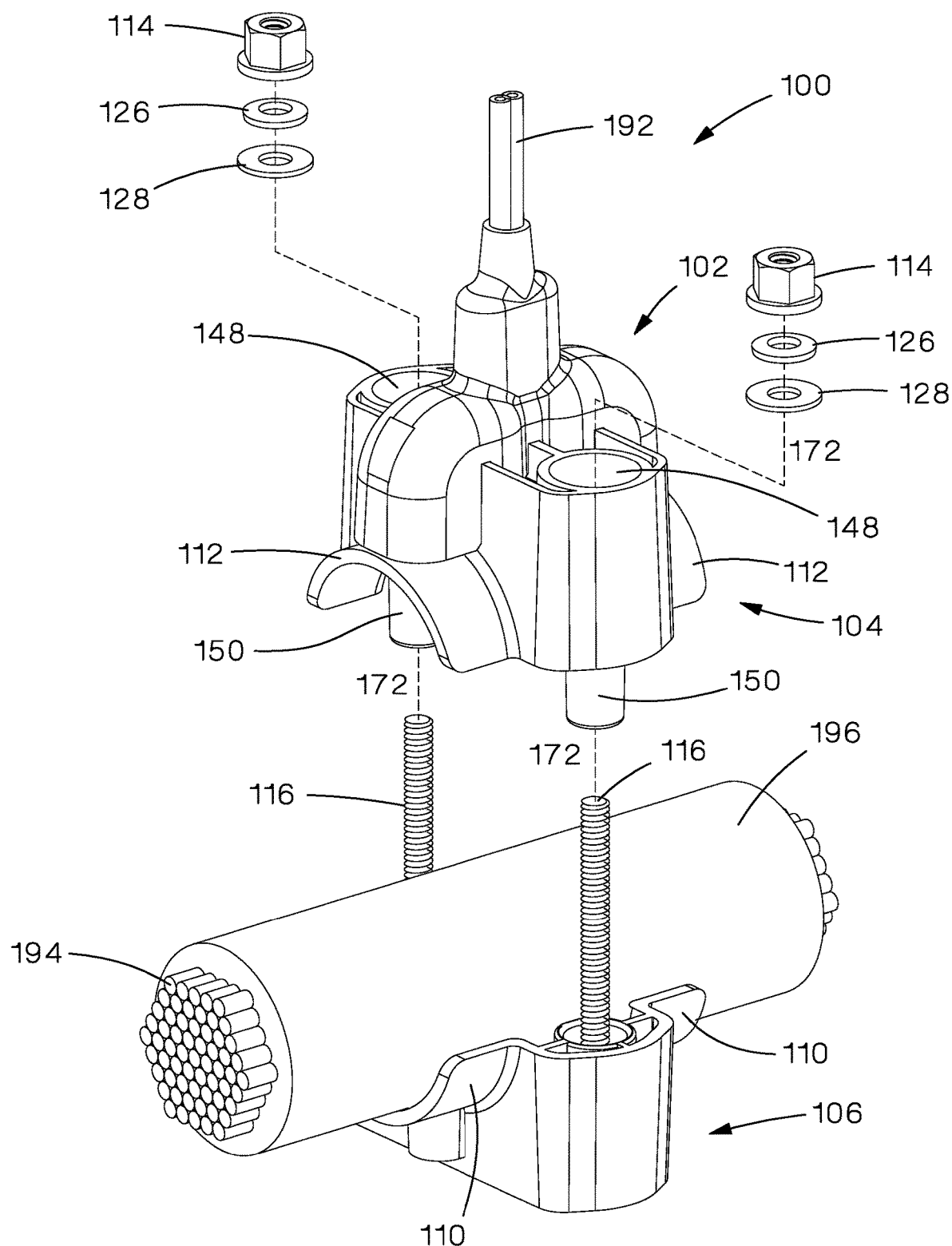
FIG. 9 shows an exploded view of the insulation piercing connector shown in FIG. 6 according to another assembled state.

FIG. 9 shows the exemplary insulation piercing connector 100 with the outer insulator 102 positioned over the tap wire housing 118. After verification of a proper tap wire installation, an electrician may move the outer insulator 102 downward towards the tap wire housing 118 until the outer insulator 102 completely encompasses and/or obscures the tap wire housing 118. The outer insulator 102 may friction-fit with the tap wire housing 118. In an alternate embodiment, the tap wire housing 118 may form a connection with the outer insulator 102 via any appropriate securing mechanism. Once the outer insulator 102 is fully fitted onto tap wire housing 118, a cable tie may be placed on the top portion 140 of outer insulator 102 to secure the tap wires 192 in place.

The outer insulator 102 may provide a variety of advantages to the present disclosure, two of which may include (1) ensuring electrical isolation of internal energized metal from the exterior of the insulation piercing connector 100, and (2) providing supplemental cable routing and retention capability for securing installed tap wires 192 when cable ties (or other cable management devices) are installed just below the opening 142. In an example, installation and securement of tap wires 192 may be completed before assembly of the insulation piercing connector 100 to phase wire 196.

FIG. 9 shows insulation piercing connector 100 with phase wire 196 resting on first concave portions 110 and ready for connection. In the current embodiment, the bolts 116 and support plate 132 (not shown) are positioned into recesses (not shown) within the bottom housing 106. The threaded portion of the bolts 116 follows dashed lines 172 into the cylindrical extensions 150 of top housing 104. The nuts 114, spring washers 126, and flat washers 128 may follow the path of the dashed lines 172 to be threaded onto the carriage bolts 116 as they appear through openings 148. Torque may be applied to the nuts 114 until a specified torque is achieved which ensures proper termination of the insulation piercing connector 100 onto the phase wire 196. An example of proper termination and a final assembly state for the insulation piercing connector 100 may be seen in FIG. 10. Although including two bolts 116 is optional, there are several advantages to having two bolts 116 in the example insulation piercing connector 100 disclosed. One such advantage may include that as torque is applied to both sides of the insulation piercing connector 100 the housing (both top housing 104 and bottom housing 106) are less apt to relax over time from a polymeric perspective. Additionally, the support plate 132 may reinforce the bottom housing 106 against any plastic relaxation, which may provide a solid connection over time.

Figure 10:
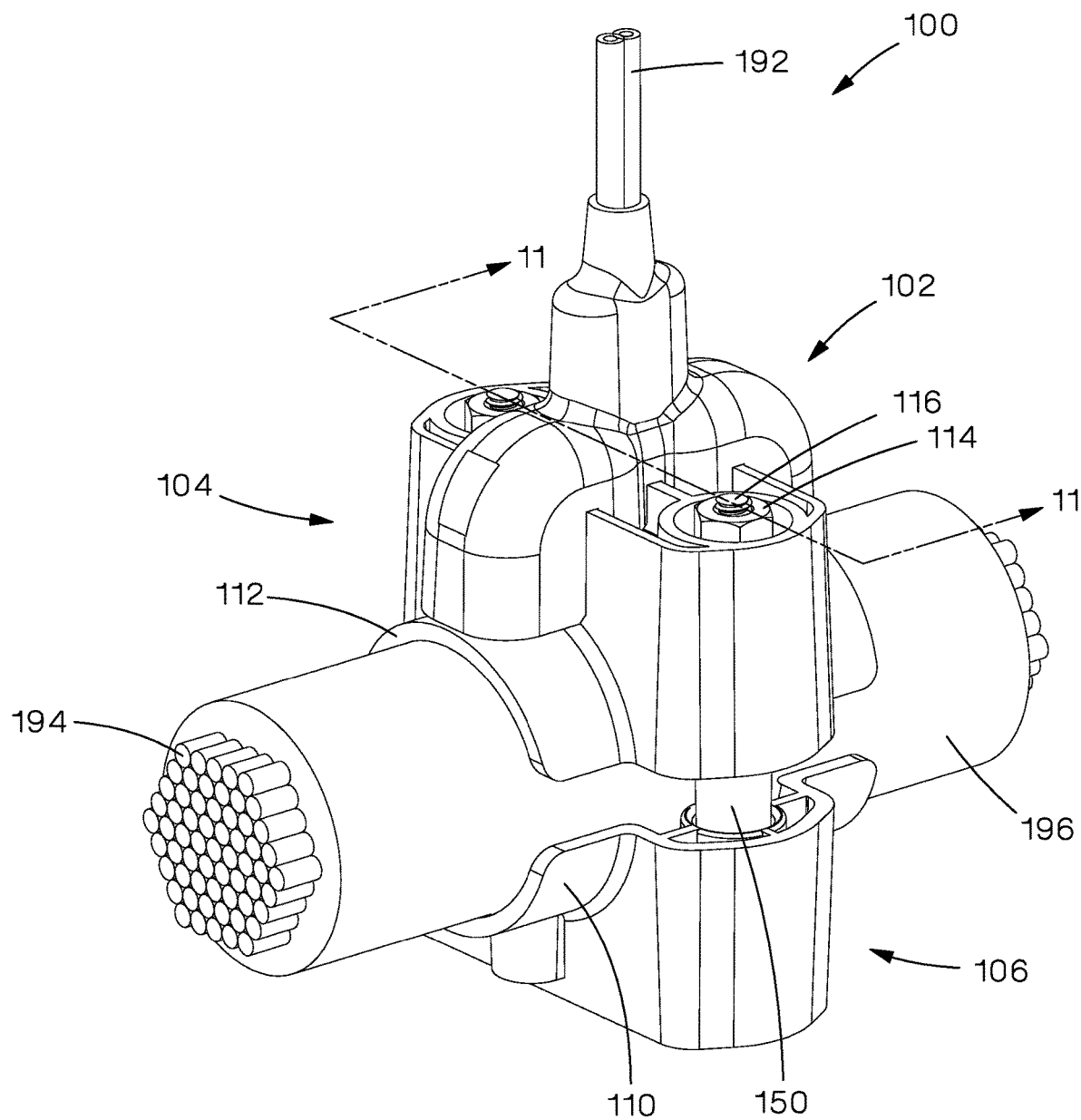
FIG. 10 shows a view of the insulation piercing connector shown in FIG. 6 according to an assembled state.
Figure 11:
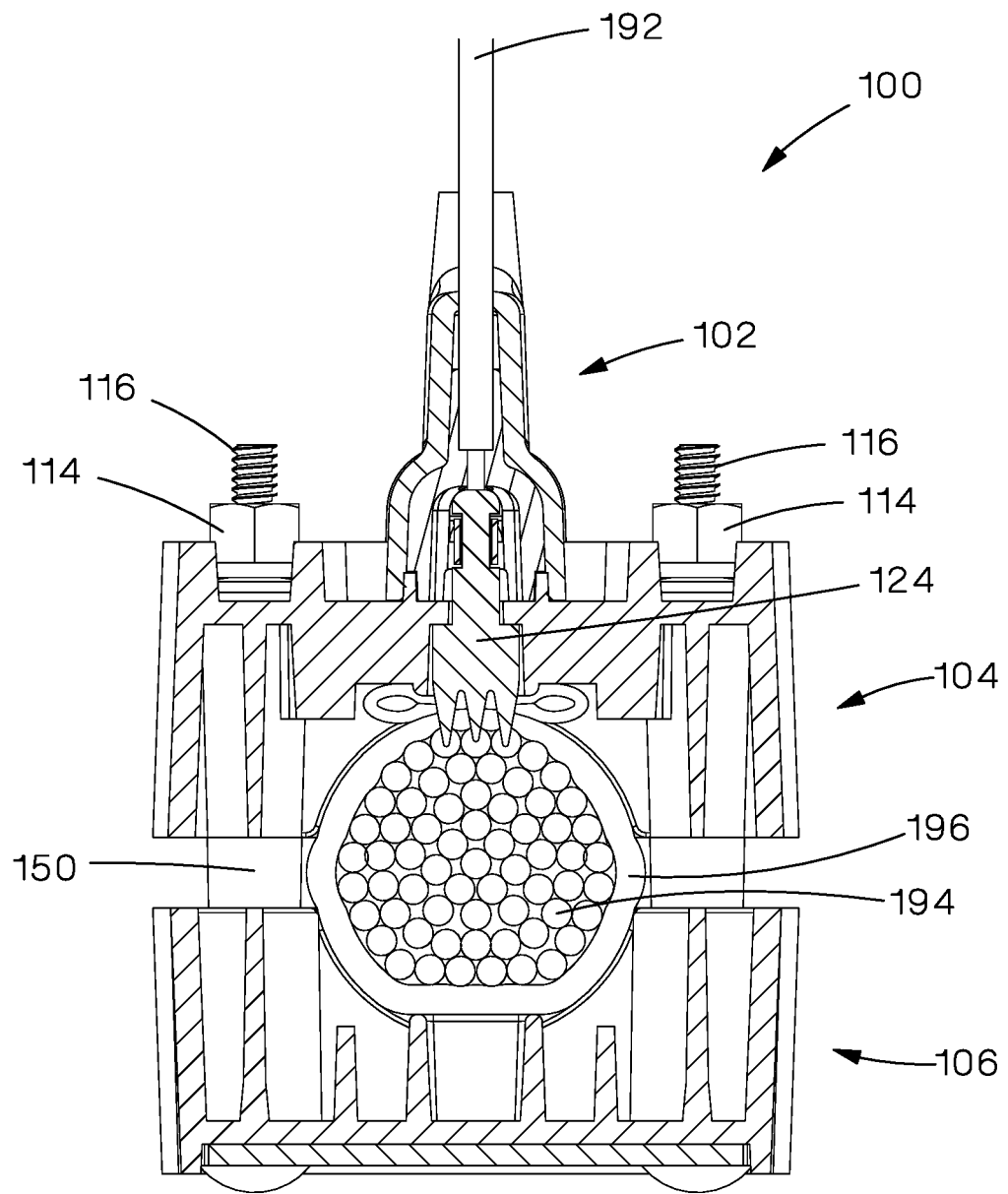
FIG. 11 shows a cross-sectional view along line 11-11 from FIG. 10 of the insulation piercing connector.

FIG. 11 is a cross-sectional view taken along line 11-11 of the insulation piercing connector 100 shown in FIG. 10. The inner insulators 130 respectively cover the teeth/blades of stamped contacts 124 prior to the insulation piercing connector 100 being compressed around phase wire 196. The inner insulators 130 prevent voltage leakage prior to compression of the top housing 104 with the bottom housing 106.

Once compressed, however, the teeth/blades of stamped contacts 124 may penetrate through the inner insulators 130 due to the compression force and may be exposed to the outer insulating layer of the phase wire 196. When further compression occurs, the two stamped contacts 124 penetrates the outer insulating layer of the phase wire 196 and contacts the conductor core of the phase wire 196 (which may be solid or stranded), thereby providing dual independent electrical connections to phase wire 196 via the two stamped contacts 124. The inner insulators 130 at this point prevent voltage leakage at the connection points between the stamped contacts 124 and the phase wire 196. In an alternate embodiment, a greater or fewer number of stamped contacts 124 and inner insulators 130 may be included depending on the intended configuration and purpose.

In an alternate embodiment, a pin in sleeve contact or a DB style connector may be utilized to replace the stamped contacts 124 shown in FIG. 11. Additionally, the embodiments disclosed may include a circuit board for providing an electrical coupling between the stamped contacts 124 and the tap wires 192.

Figure 12:
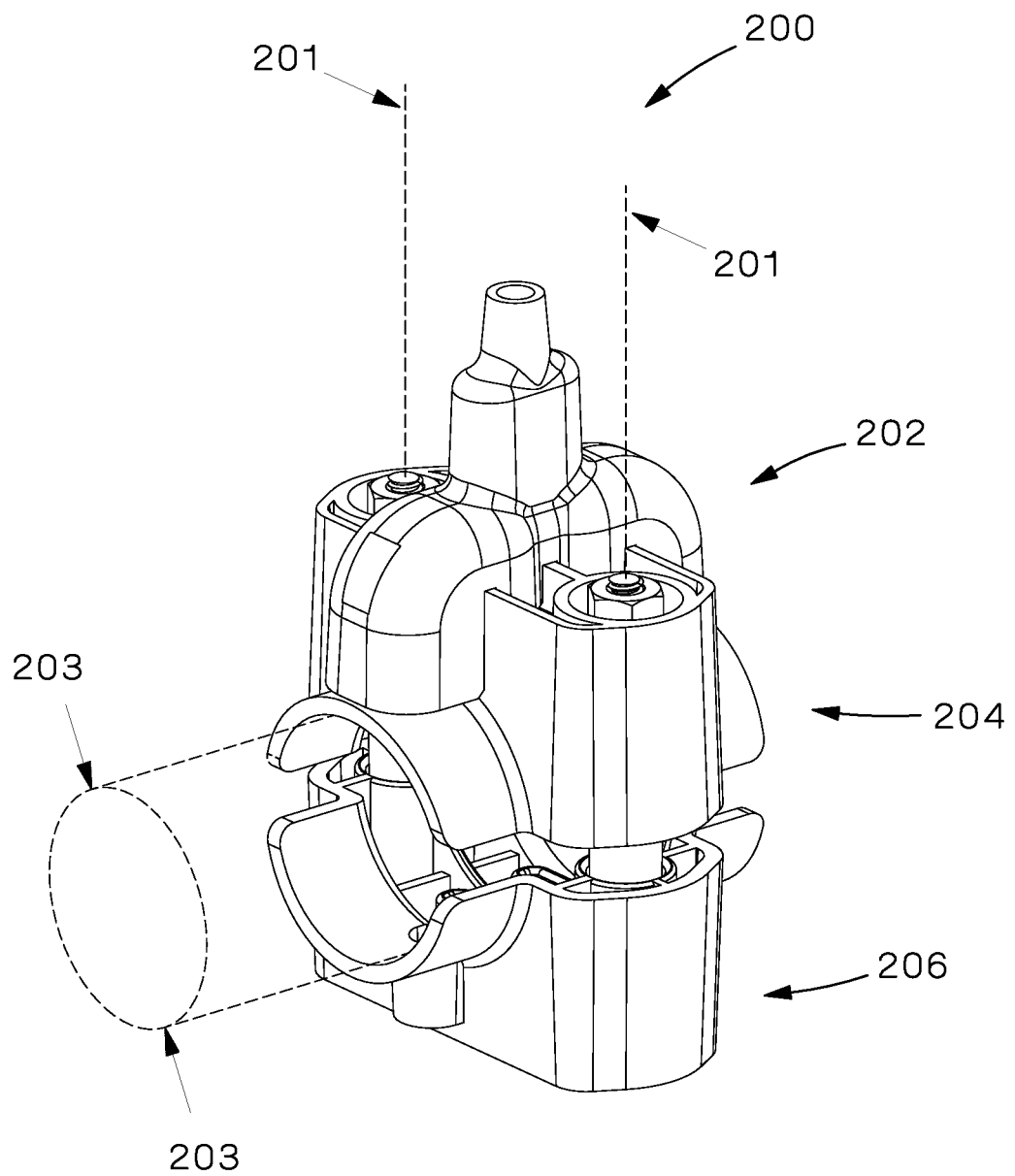
FIG. 12 shows an insulation piercing connector according to another embodiment of the present disclosure.

FIG. 12 shows an insulation piercing connector 200 according to an alternative embodiment of the present disclosure. The insulation piercing connector 200 is similar to the insulation piercing connector 100. The insulation piercing connector 200 includes an outer insulator 202, a top housing 204 and a bottom housing 206. However, insulation piercing connector 200 may be made into a variety of different sizes to fit a variety of different power cables or phase wires. In an example, the axes 201 of the main fasteners or bolts moves inward or outward as alternate embodiment sizes get smaller or larger, respectively. Additionally, the diameter 203 of the opening may get smaller or larger as alternate embodiment sizes get smaller or larger, respectively, to accommodate different ranges of wire gauge sizes of the power cable or phase wire being tested by the insulation piercing connector 200.

Figure 13:
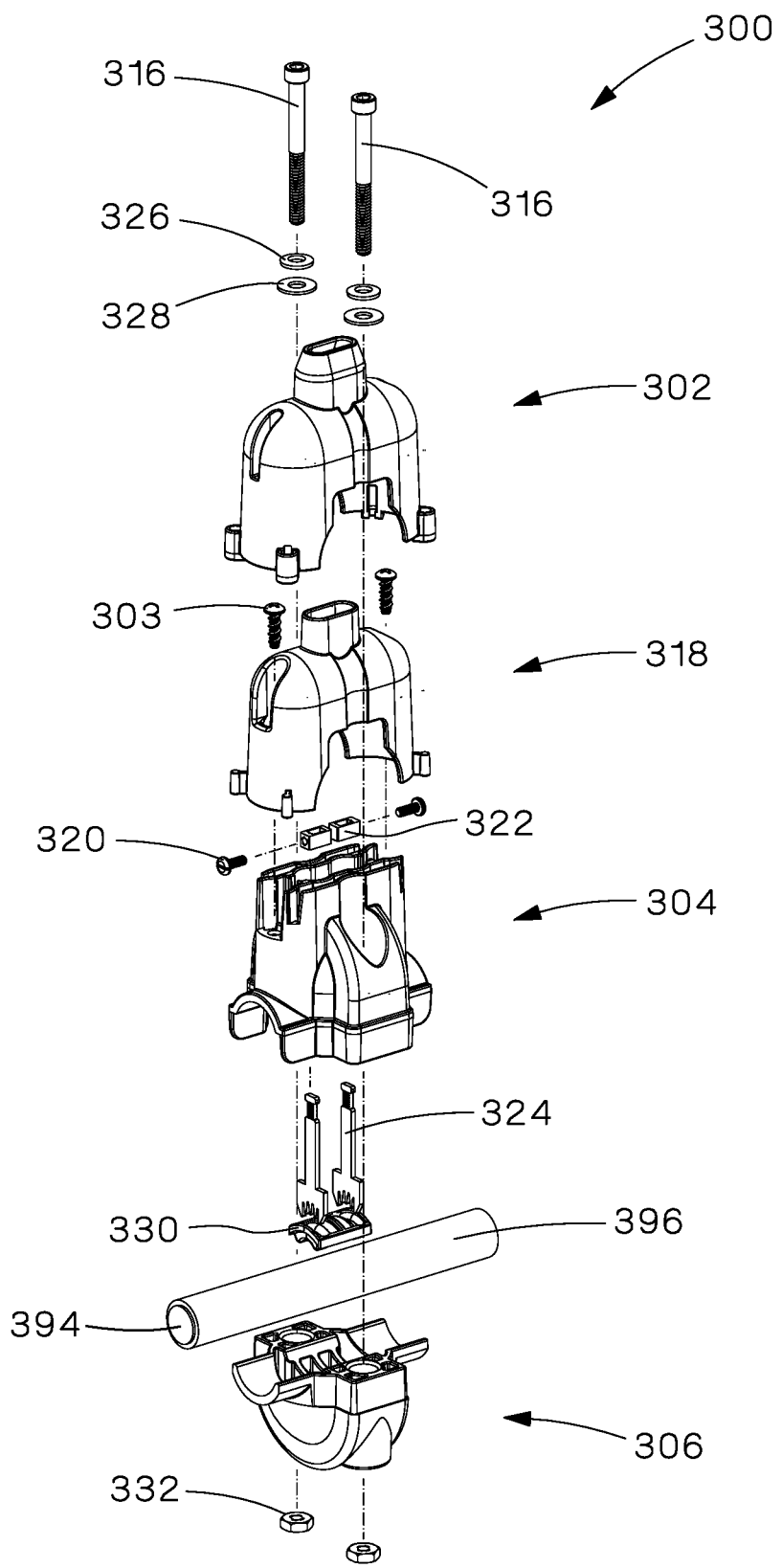
FIG. 13 shows an exploded view of an insulation piercing connector according to another embodiment of the present disclosure.

FIG. 13 shows an exploded view of an insulation piercing connector 300 according to another embodiment of the present disclosure. This alternative design of the insulation piercing connector 300 provides a consistent design aesthetic and installation methodology for a wider range of wire gauge sizes of phase wires that will be tested.

The insulation piercing connector 300 includes an outer insulator 302 for covering over a tap wire housing 318, where the attachment mechanism between the outer insulator 302 and the tap wire housing 318 is described in more detail with reference to FIGS. 18-20. The outer insulator 302 provides electrical isolation from the interior of the insulation piercing connector 300, and provide a shape for enabling cable routing and retention features for securing installed tap wires using, for example, cable ties or other cable management devices.

Figure 17:
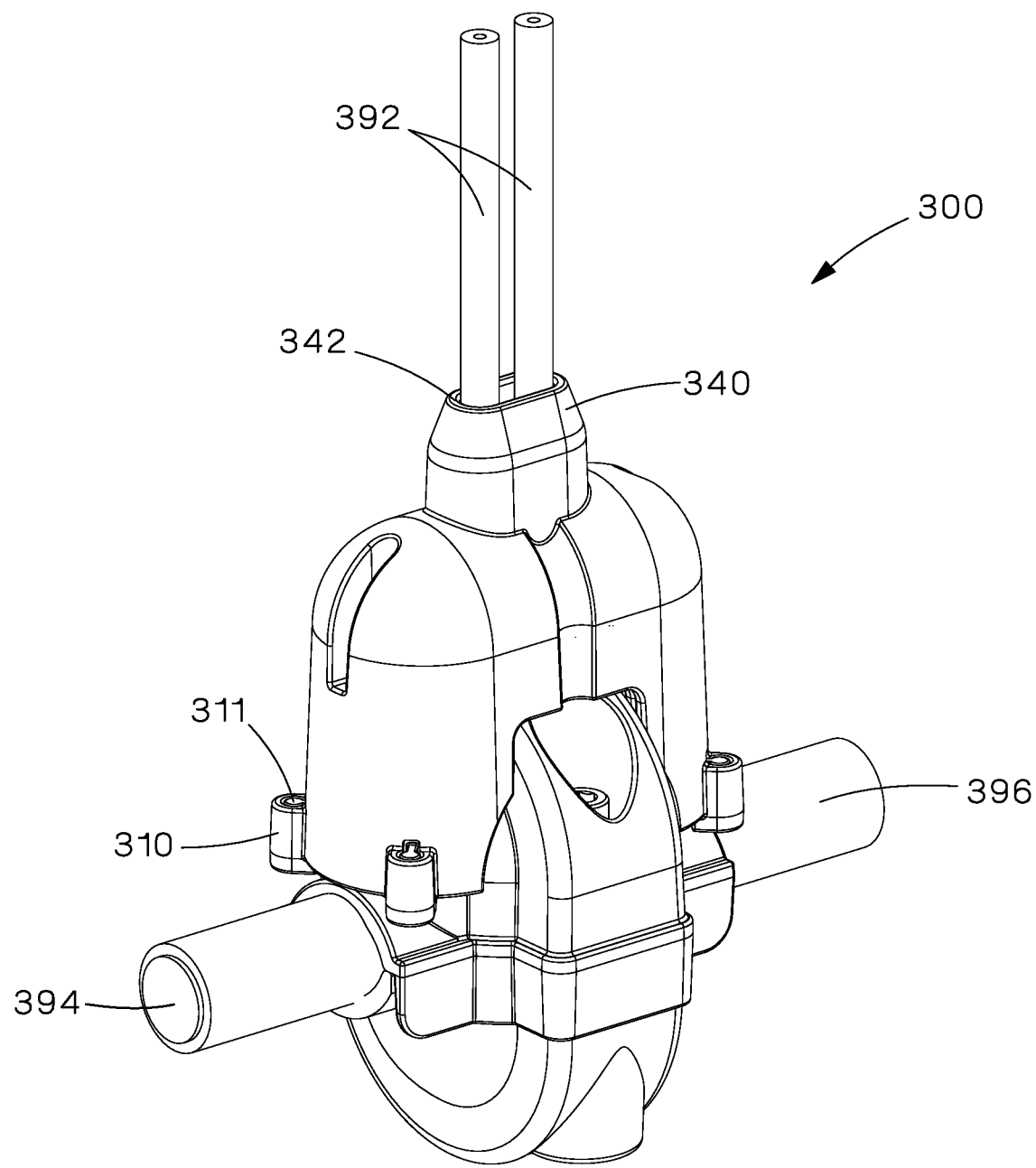
FIG. 17 shows a view of the insulation piercing connector shown in FIG. 13 according to an assembled state.

The insulation piercing connector 300 further includes a top housing 304 and a bottom housing 306. The top housing 304 includes a bottom portion formed in a concave portion, and the bottom housing 306 includes a top portion formed in a concave portion. The top housing 304 and the bottom housing 306 are configured to come together in an assembled state to receive the phase wire 396 to fit within a cylindrical recess formed by the respective concave portions of the top housing 304 and the bottom housing 306. For example, FIG. 17 shows the insulation piercing connector 300 in the assembled state where the top housing 304 and the bottom housing 306 have come together to receive the phase wire 396 to fit within the cylindrical recess formed by the respective concave portions of the top housing 304 and the bottom housing 306.

As shown in FIG. 13, the insulation piercing connector 300 includes various fastener and connection components to bring the insulation piercing connector 300 into the final assembled state. To secure the tap wire housing 318 to the top housing 304, two screws 303 (e.g., self-tapping screws) are inserted down through openings on the tap wire housing 318 and secured into threaded receiving holes in the top housing 304. To secure the top housing 304 to the bottom housing 306, two bolts 316 (e.g., hex drive cap bolts) are inserted down through openings on the top housing with the use of spring washers 326 and flat washers 328, and through openings on the bottom housing 306, before hex nuts 332 are fastened to the threaded ends of the hex drive cap bolt at the bottom-side of the bottom housing 306.

The insulation piercing connector 300 also includes an insulation piercing assembly comprised of terminal adjustment screws 320, terminal housings 322, and stamped contacts 324. The insulation piercing assembly of the insulation piercing connector 300 operates in the same manner as described for the insulation piercing assembly included in the insulation piercing connector 100. The insulation piercing connector 300 also includes an inner insulator 330 that covers within the top housing 304, at least partially, the end of the stamped contacts 324 including the piercing tines when the insulation piercing connector 300 is in the assembled state.

Figure 14:
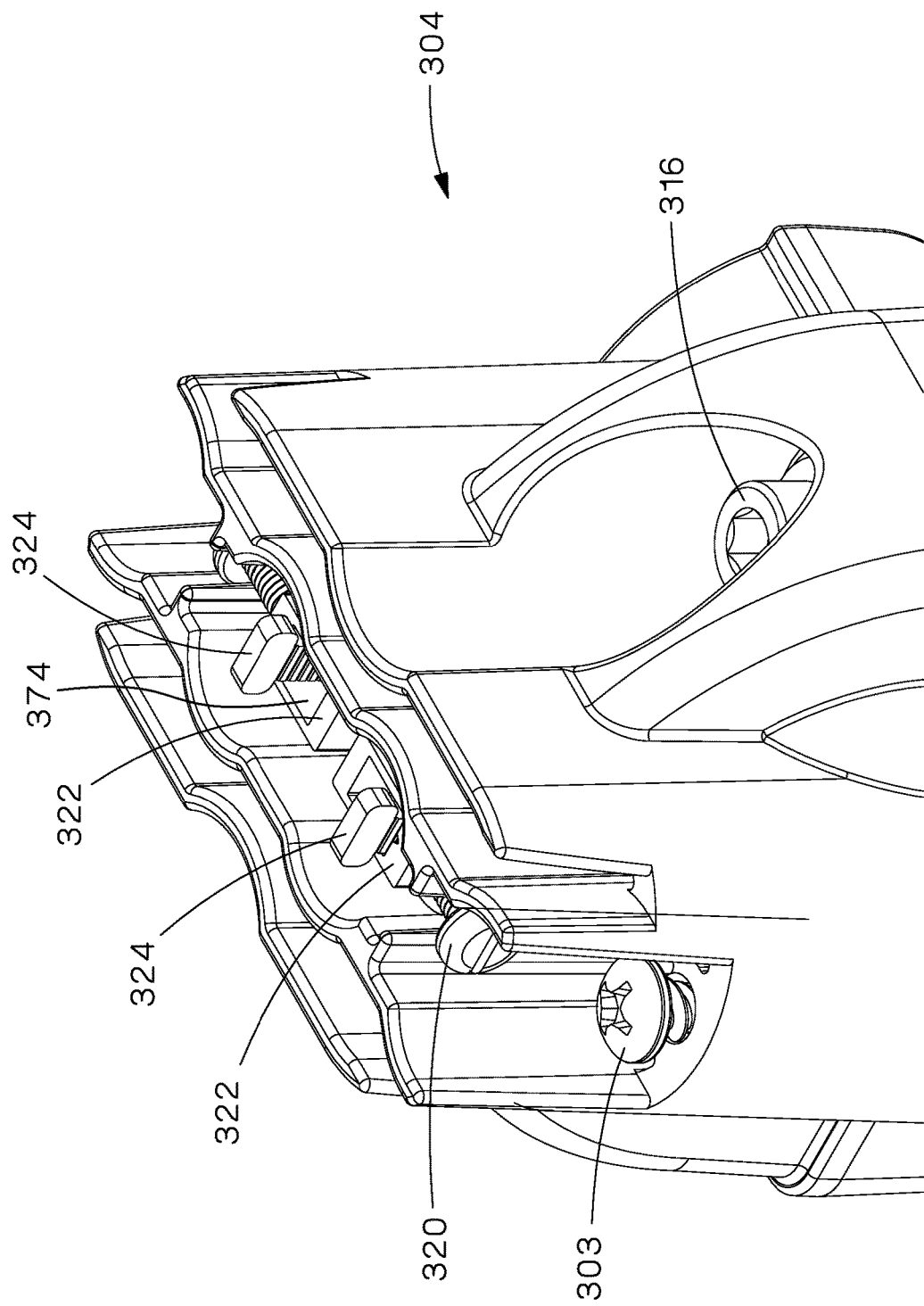
FIG. 14 shows an enlarged view of a portion of the insulation piercing connector shown in FIG. 13.

FIG. 14 shows an enlarged view of the top housing 304 and an illustration of how the insulation piercing assembly fits within the top housing 304 in the assembled state. In the assembled state, a top end of the stamped contacts 324 is shown to include shoulders that rest on top of the terminal housings 322. An exposed conductor portion of the tap wires 392 is inserted to fit within a space 374 between the stamped contacts 324 and the inner surface of the terminal housings 322. The terminal adjustment screws 320 are adjusted (e.g., rotated/screwed) to control the size of the space 374 to accommodate the tap wires 392 held by the insulation piercing assembly, to either secure the tap wires 392 or release the tap wires 392 from the insulation piercing assembly. During an installation process of the tap wires 392 into the insulation piercing connector 300, a user applies torque on the terminal adjustment screws 320 until a specified torque value is applied, thereby applying pressure on the tap wire 392 that rests within the space 374 by compressing the space 374 between the stamped contacts 324 and the inner surface of the terminal housings 322. The installation of the tap wires 392 into the insulation piercing assembly of the insulation piercing connector 300 may be completed prior to, or after, field installation of the insulation piercing connector 300 to the phase wire 396.

FIG. 14 also shows how the screws 303 are secured into the threaded openings of the top housing 304. FIG. 14 also shows how the bolt 316 is inserted down into the opening of the top housing 304 to be received by a corresponding opening of the bottom housing 306.

Figure 15:
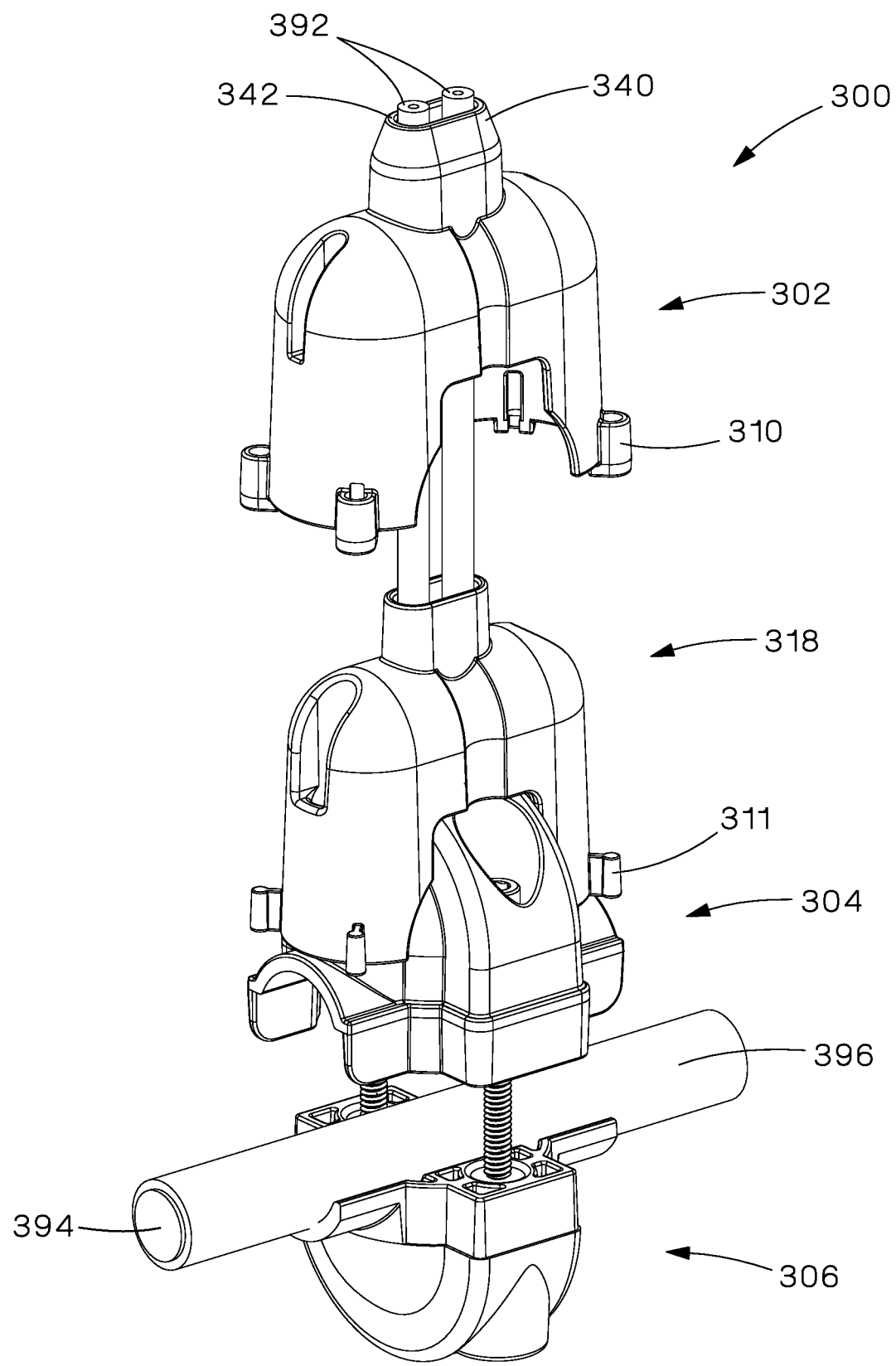
FIG. 15 shows an exploded view of the insulation piercing connector shown in FIG. 13 according to another assembled state.

FIG. 15 shows the insulation piercing connector 300 in a partially assembled state, where the tap wire housing 318 is secured to the top housing 304. FIG. 15 also shows the tap wires 392 inserted down through the insulation piercing connector 300. In particular, the outer insulator includes a top portion 340, where the top portion 340 includes a top opening 342 through which the tap wires 392 are received. In this partially assembled state, the tap wire housing 318 is secured to the top housing 304 by the screws 303 (not shown).

Figure 16:
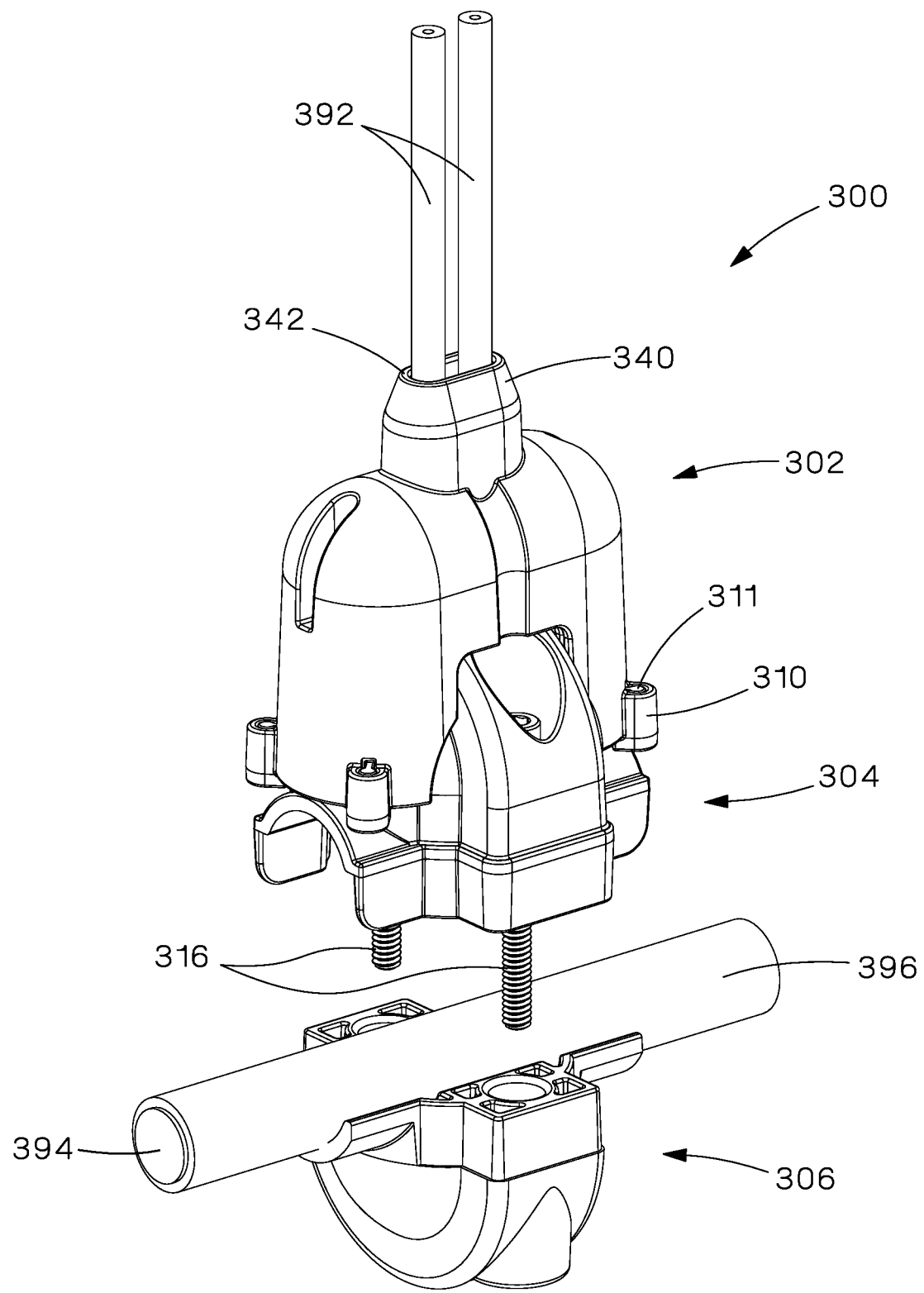
FIG. 16 shows an exploded view of the insulation piercing connector shown in FIG. 13 according to another assembled state.

FIG. 16 shows the insulation piercing connector 300 in a further partially assembled state where the outer insulator 302 is fit over the tap wire housing 318. The outer insulator 302 is secured to the tap wire housing 318 via a snap-fit mechanism where the outer insulator 302 includes four socket openings 310 for each receiving their own respective socket protrusion 311 formed on the tap wire housing 318. The insulation piercing connector 300 is shown to include four socket openings 310 on the outer insulator 302 and four socket protrusions 311 on the tap wire housing 318, however any number of one or more socket openings 310 and one or more socket protrusions 311 may be used according to other embodiments.

Figure 19A:
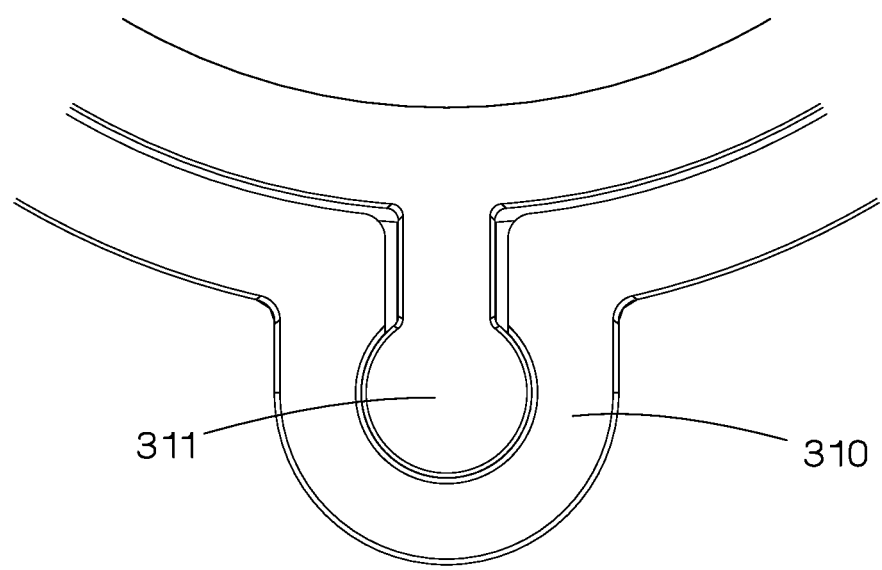
FIG. 19A shows an enlarged view of a portion of the insulation piercing connector shown in FIG. 18A in an attached state.
Figure 19B:
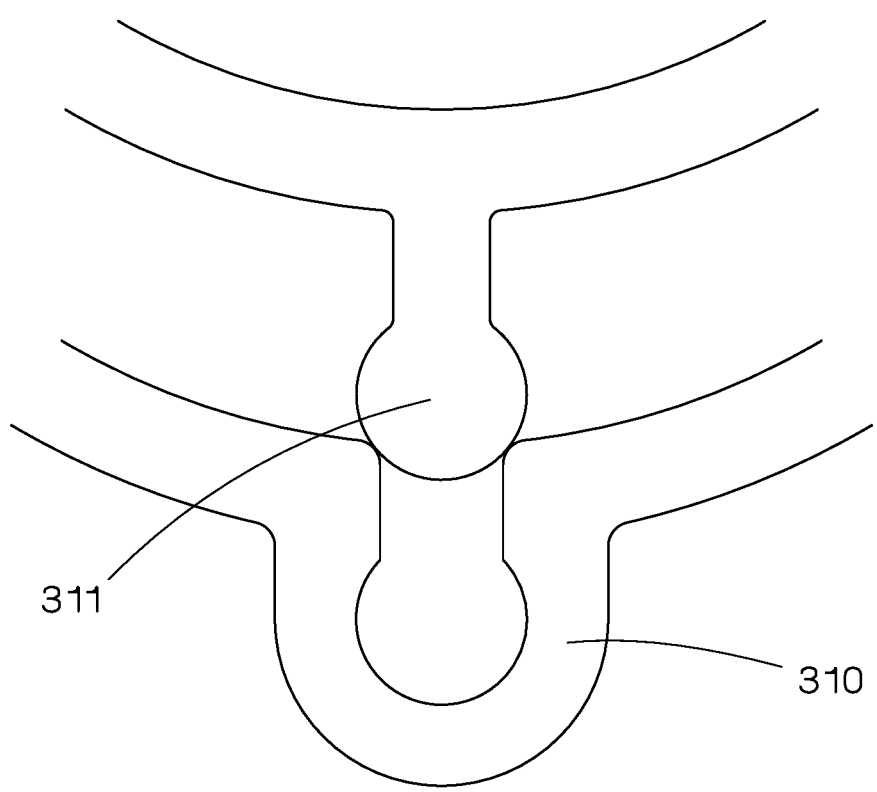
FIG. 19B shows an enlarged view of a portion of the insulation piercing connector shown in FIG. 19A in a detached state.

As shown in FIG. 18A, the outer insulator 302 is provided to fit over the tap wire housing 318 such that the socket openings 310 come down and snap-fit over the socket protrusions 311 of the tap wire housing 318. FIG. 18B shows an assembled state where the outer insulator 302 has been snap-fit onto the tap wire housing 318. FIG. 18B also shows an enlarged view over area A that includes a specific illustration of how the socket protrusion 311 fits inside the socket opening 310 to accomplish the snap-fit attachment mechanism. FIG. 19A shows another enlarged view of the socket protrusion 311 in an attached state where the socket protrusion 311 engages the socket opening 310 by being snap-fit into the socket opening 310. FIG. 19B shows an enlarged view of a detached state where the socket protrusion 311 has been detached from the socket opening 310. The outer insulator 302, including the socket opening 310, may be made from a plastic or other elastomer material that allows the socket opening 310 to deform for allowing the socket protrusion 311 to fit into, and out of, the socket opening 310 during the attachment and detachment process.

Figure 20:
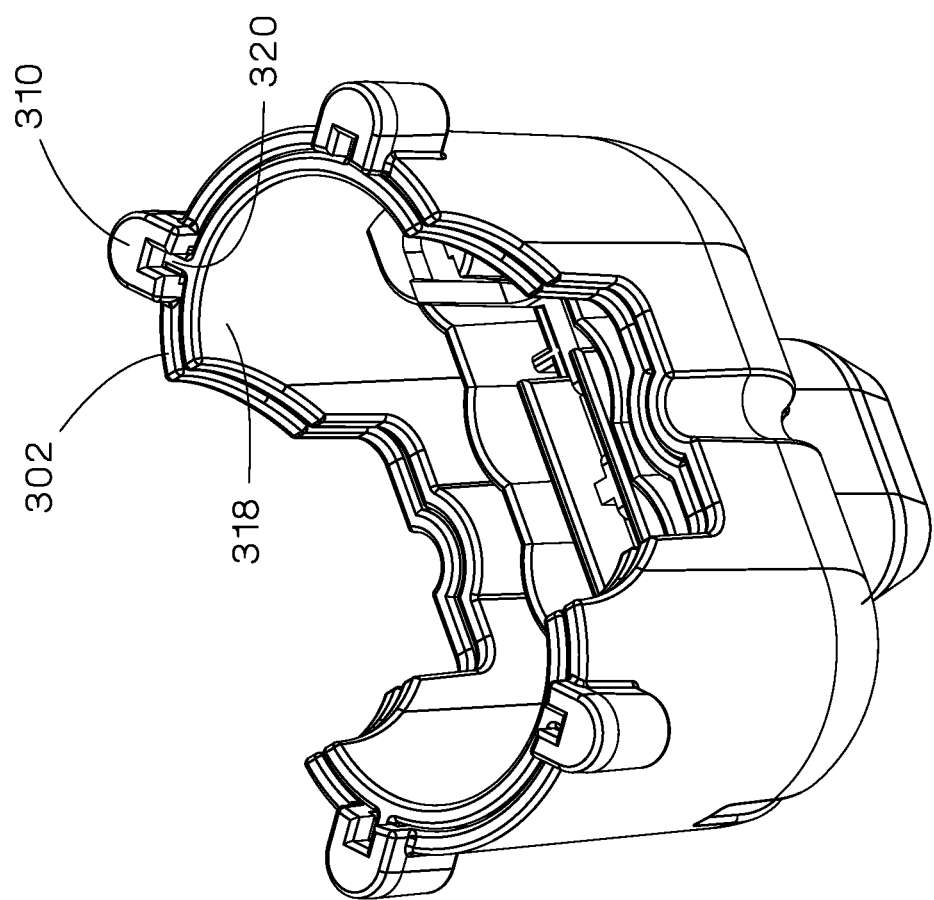
FIG. 20 shows a bottom-side view of the portion of the insulation piercing connector shown in FIG. 18B.

FIG. 20 shows a bottom-side view of the of the outer insulator 302 and the tap wire housing 318 in their attached state. From this bottom-side view, the snap-fitment of the socket protrusion 311 to fit within the socket opening 310 can be seen. The outer insulator 302 and/or the tap wire housing 318 may be formed using a straight-pull injection-molding process, or other manufacturing process that does not require complicated side action or other advanced manufacturing methods.

FIG. 17 shows the insulation piercing connector 300 in the assembled state where the tap wires 392 enter the insulation piercing connector 300 through the top opening 342 and runs internally through the insulation piercing connector 300 to attach to the insulation piercing assembly within the top housing 304. Also in this assembled state, the phase wire 396 is securely fit into the cylindrical recess created by the concave portions of the top housing 304 and the bottom housing 306 coming together. Also in this assembled state, the stamped contacts 324 (not shown) pierce through an insulation covering of the phase wire 396 to make electrical contact with an inner conductor of the phase wire 396. To achieve this assembled state, torque may be applied to the bolts 316 until a predetermined torque is achieved to ensure proposer termination of the insulation piercing connector 300 to the phase wire 396.

Figure 21:
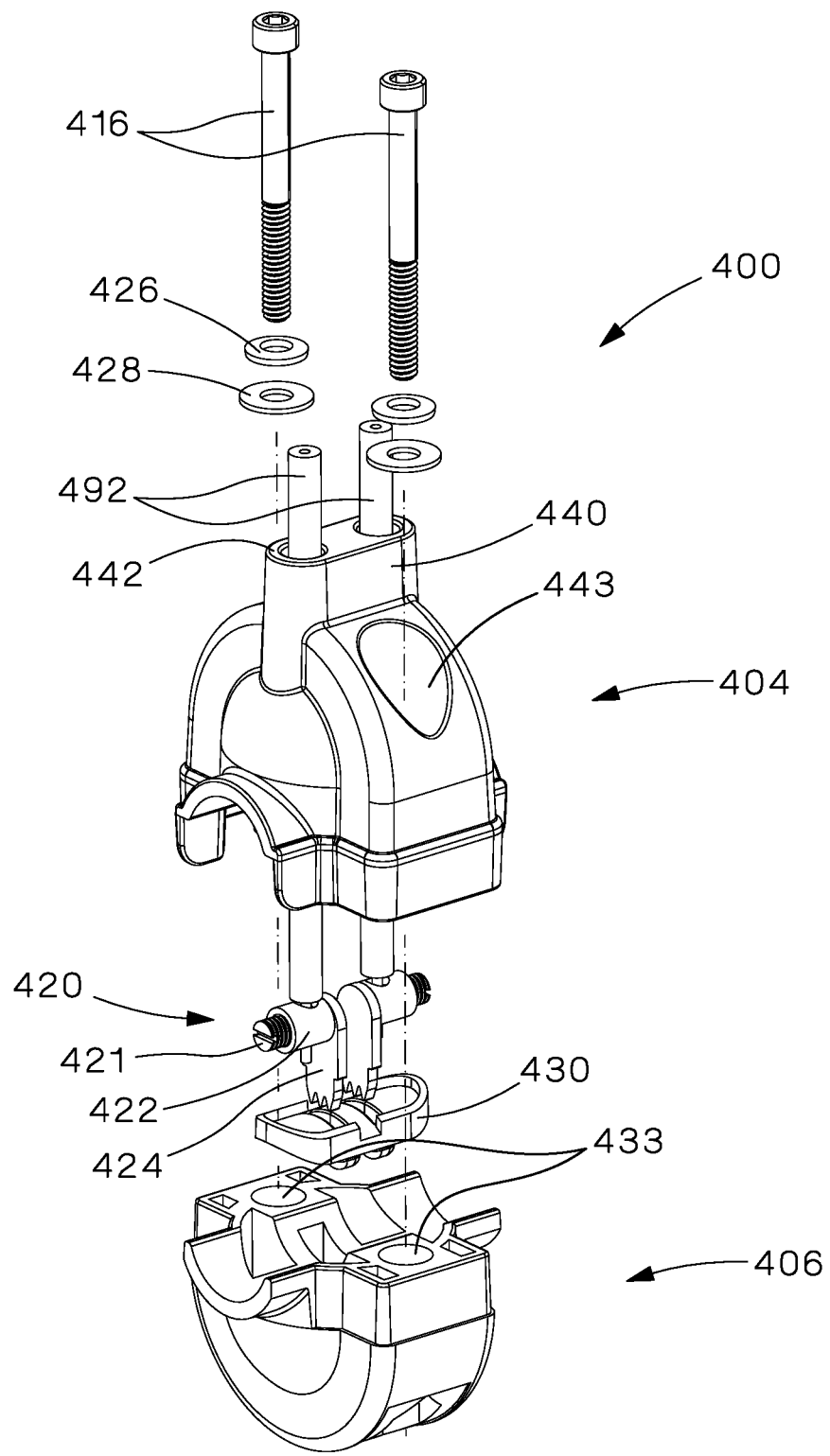
FIG. 21 shows an exploded view of an insulation piercing connector according to another embodiment of the present disclosure.

FIG. 21 shows an exploded view of an insulation piercing connector 400 according to another embodiment of the present disclosure. The insulation piercing connector 400 is similar to the insulation piercing connector 300, but having the outer insulator 302, tap wire housing 318, and related fastener components removed. This alternative design of the insulation piercing connector 400 may provide improved structural optimization (rigidity), reduced number of components within the product assembly, improved functionality in the form of improved di-electric performance, and a simplified installation methodology.

Figure 24:
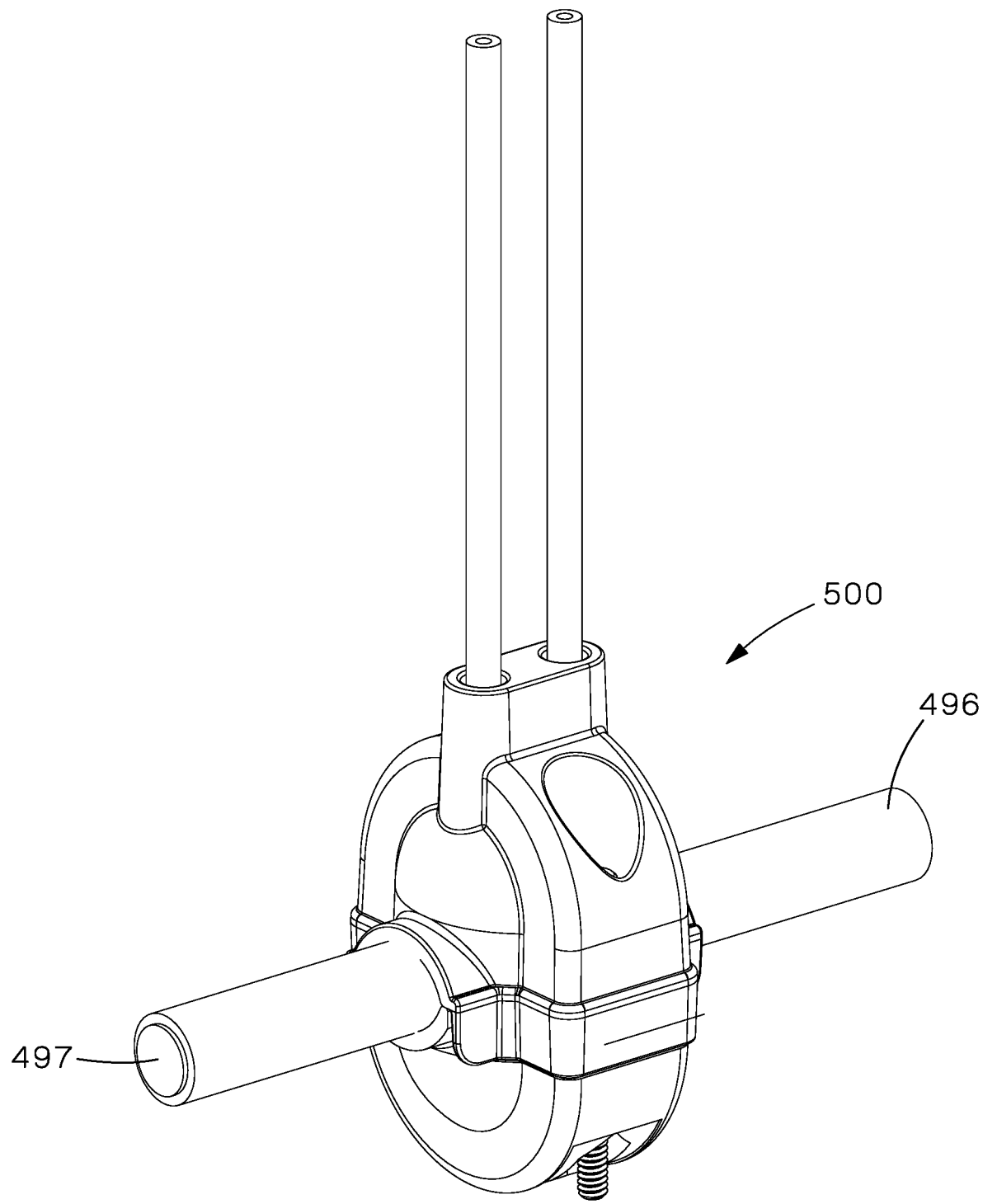
FIG. 24 shows a view of the insulation piercing connector shown in FIG. 21 according to an assembled state.

The insulation piercing connector 400 includes the top housing 404 and the bottom housing 406, where the top housing 404 and the bottom housing 406 are attached using the bolts 416 (e.g., hex driven cap bolts), the spring washers 426, and the flat washers 428. The bolts 416 are inserted through openings 443 on the top housing 404, and down through openings 433 on the bottom housing 406. According to some embodiments, the threaded end of the bolts 416 are secured to inner threads within the openings 433 of the bottom housing 406. According to other embodiments, nuts (not illustrated) are threaded onto the threaded ends of the bolts 416 at the bottom-side of the bottom housing 406 after the bolts have been inserted through both the openings 443 and the openings 433. When the top housing 404 and the bottom housing 406 are attached together, they form a cylindrical recess for holding the phase wire 496, as shown in FIG. 24 that illustrates the insulation piercing connector 400 in the assembled state. The top housing 404 includes a top portion 440 and a top opening 442 for receiving the tap wires 492.

The insulation piercing assembly in the insulation piercing connector 400 uses a simpler design with fewer components when compared to the insulation piercing assembly used in the insulation piercing connector 300. This simpler design will be described as the integrated contact assembly 420 of the insulation piercing connector 400. The integrated contact assembly 420 includes a screw fastener 421 and an integrated housing and piercing contact (integrated HPC) that combines the housing 422 and the piercing contact 424 into a single-piece component. A more detailed description of the integrated contact assembly 420 is provided with respect to FIGS. 25-27. Related to the integrated contact assembly 420, the insulation piercing connector 400 also includes an inner insulator 430. The inner insulator 430 may be made from an elastomer material and be configured to fit within an inner housing of the top housing 404 to cover, at least partially, the piercing contact 424.

Figure 22:
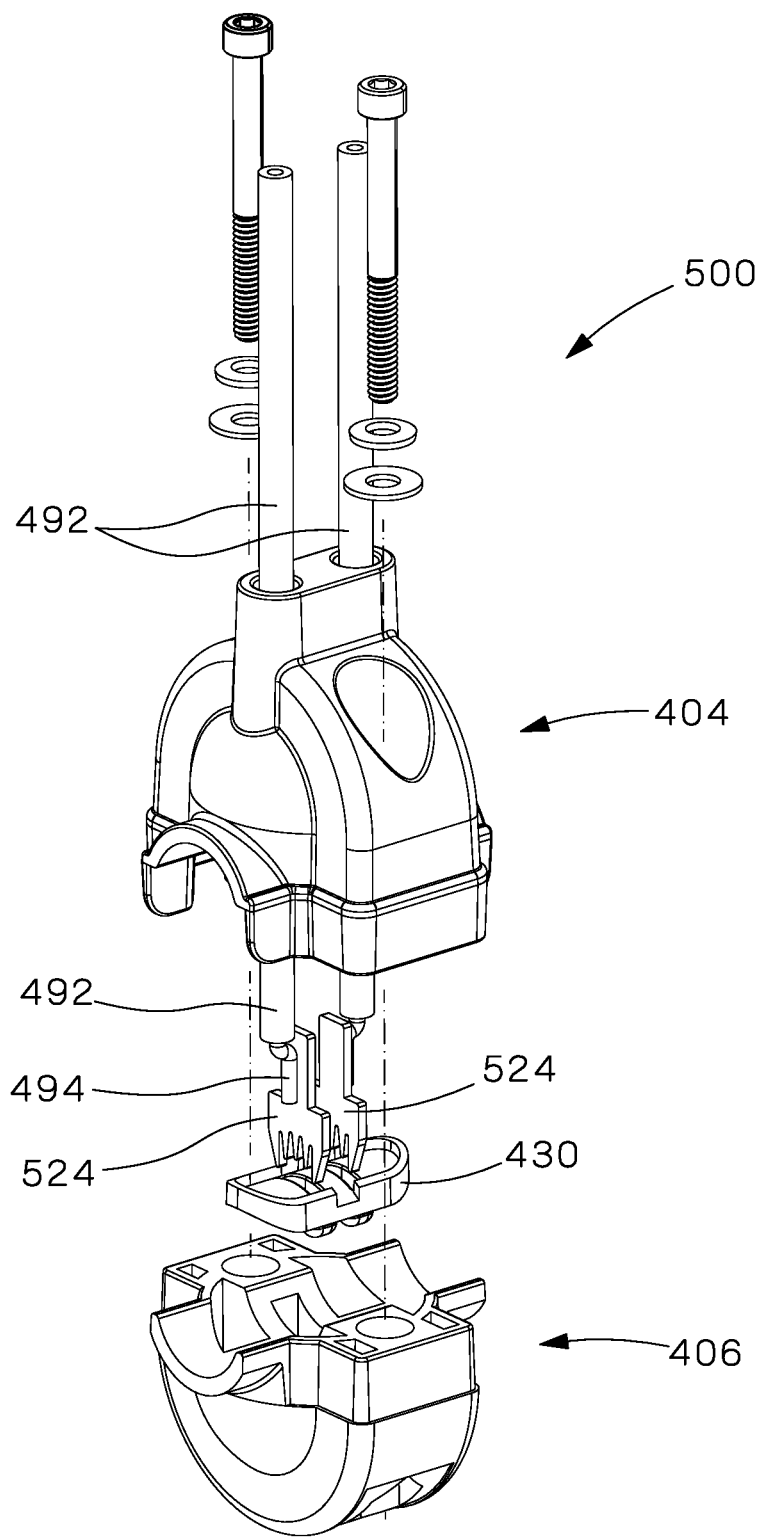
FIG. 22 shows the insulation piercing connector shown in FIG. 21 using an alternative embodiment of terminal contacts.

FIG. 22 shows an insulation piercing connector 500 according to an alternative embodiment that includes the insulation piercing connector 400 using an alternative embodiment of the insulation piercing assembly. According to the insulation piercing connector 500, the insulation piercing assembly directly attaches the stamped contacts 524 to an exposed conductor 494 of the tap wires 492. The stamped contacts 524 may be attached to the exposed conductor 494 using an adhesive, welding process, or other known attachment process.

Figure 23:
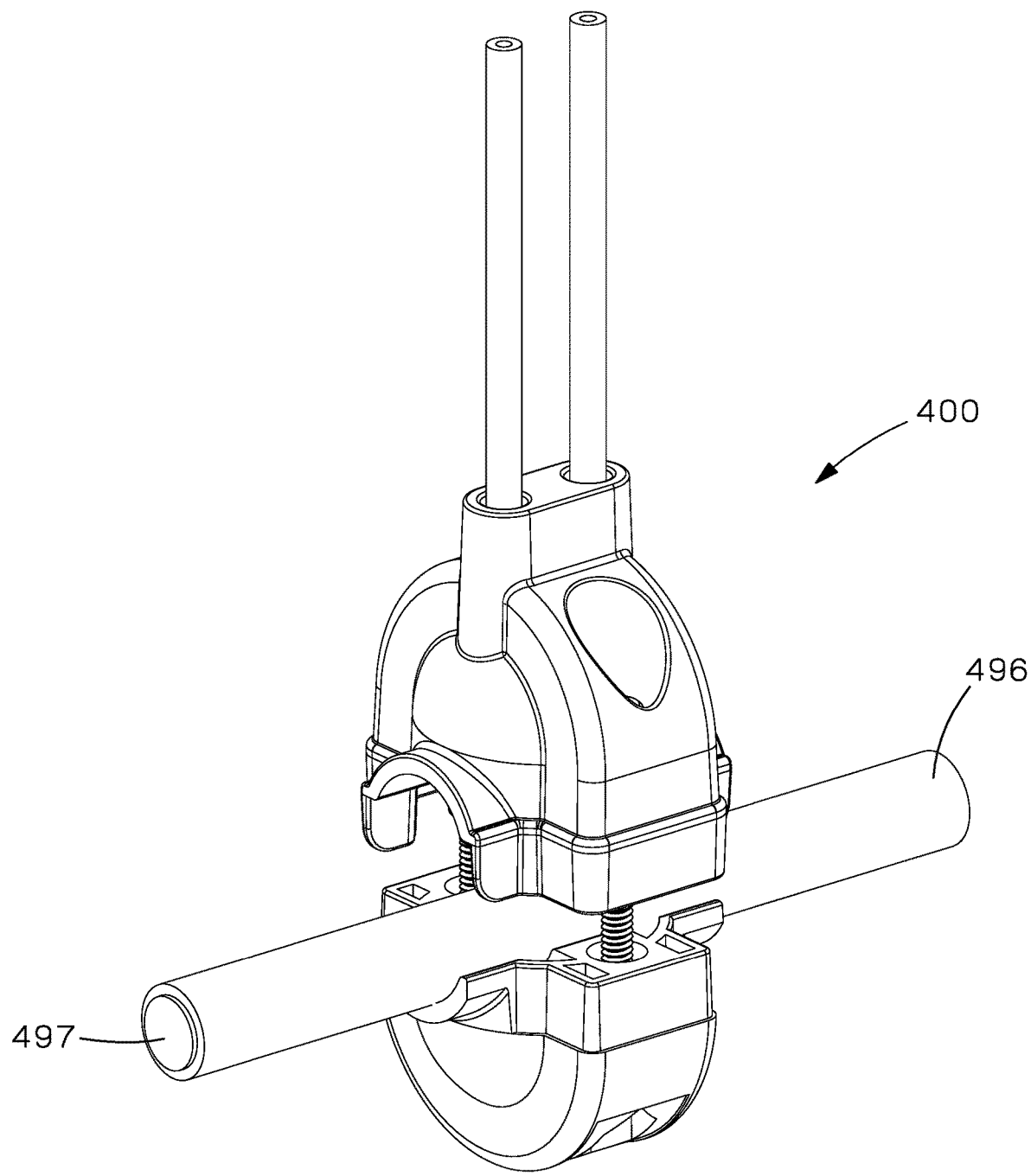
FIG. 23 shows an exploded view of the insulation piercing connector shown in FIG. 21 according to another assembled state.

FIG. 23 shows the insulation piercing connector 400 in a partially assembled state where the tap wires 492 have been inserted and connected to the integrated contact assembly 420, and the phase wire 496 has been placed within the cylindrical recess being formed by the top housing 404 and the bottom housing 406.

FIG. 24 shows the insulation piercing connector 400 in the assembled state where the tap wires 492 have been inserted and connected to the integrated contact assembly 420, and where the piercing contacts 424 (not illustrated) are internally positioned to pierce the phase wire 496 that is now placed within the cylindrical recess formed by the top housing 404 and the bottom housing 406 coming together in the assembled state. Although FIGS. 23 and 24 have been described as relating to the insulation piercing connector 400 using the integrated contact assembly 420, FIGS. 23 and 24 may also apply to the insulation piercing connector 500 using the insulation piercing assembly that directly attaches the stamped contacts 524 to the exposed conductor 494 of the tap wires 492.

Figure 25:
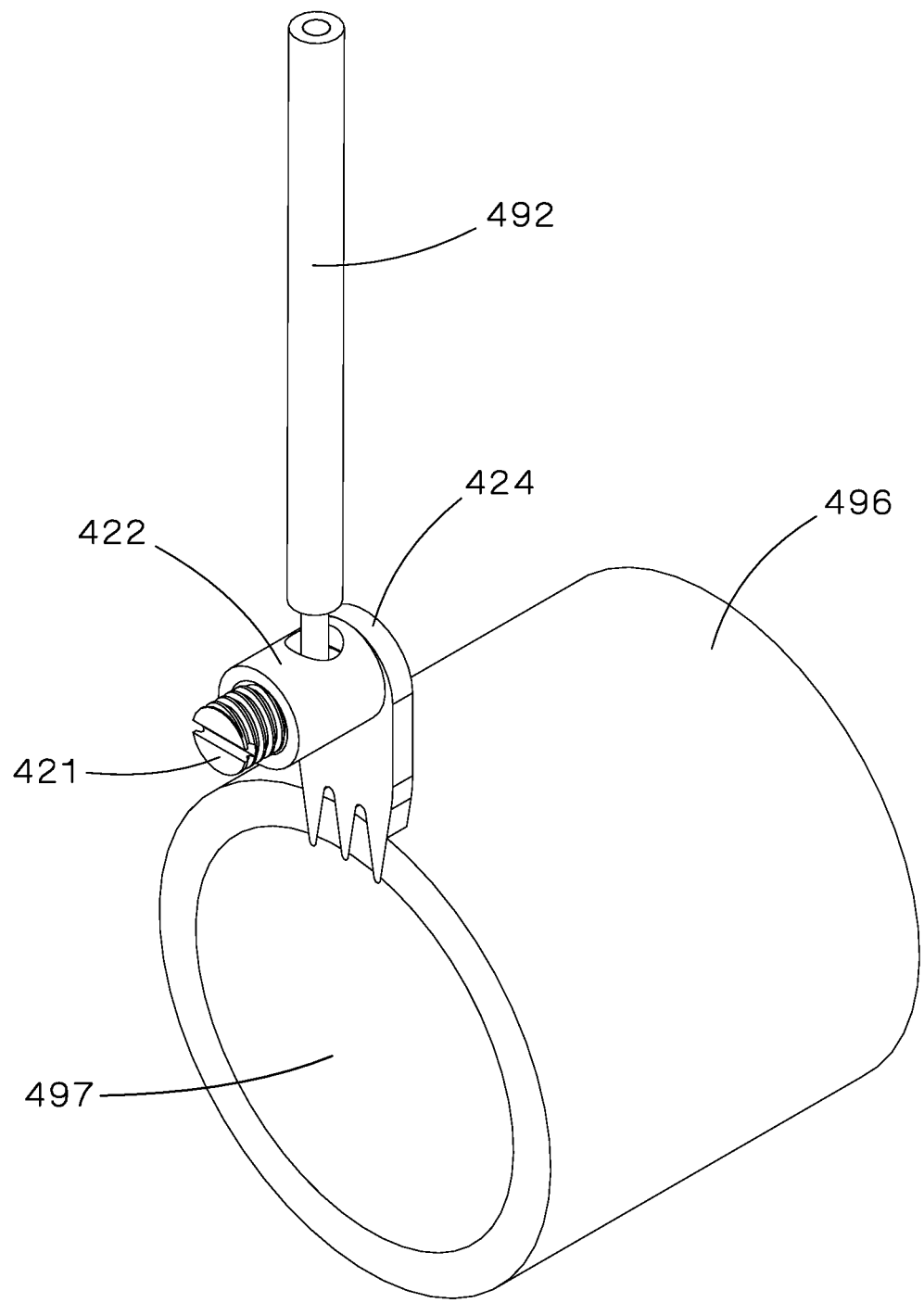
FIG. 25 shows a view of an integral screw-terminal contact included in the insulation piercing connector shown in FIG. 21, where the integral screw-terminal contact is attached to a wire.

FIG. 25 shows a view of the integrated contact assembly 420 where the tap wire 492 is secured to the integrated contact assembly 420, and the piercing contacts 424 are piercing the phase wire 496 to electrically connect to the conductor 497 of the phase wire 496. As shown in FIG. 25, the tap wire 492 is secured to the integrated contact assembly 420 by inserting the exposed conductor 494 into a space 425 of the housing 422. The screw fastener 421 is inserted into a fastener opening 423 of the housing 422 and a torque is applied to the screw fastener 421 to bias the screw fastener 421 towards the piercing contacts 424. This biasing of the screw fastener 421 moves the screw fastener 421 towards the piercing contacts and thereby decreases the space 425 in which the exposed conductor 494 resides. Eventually, the screw fastener will abut against the exposed conductor 494 and push the exposed conductor 494 to in turn abut against the piercing contacts 424.

Figure 26:
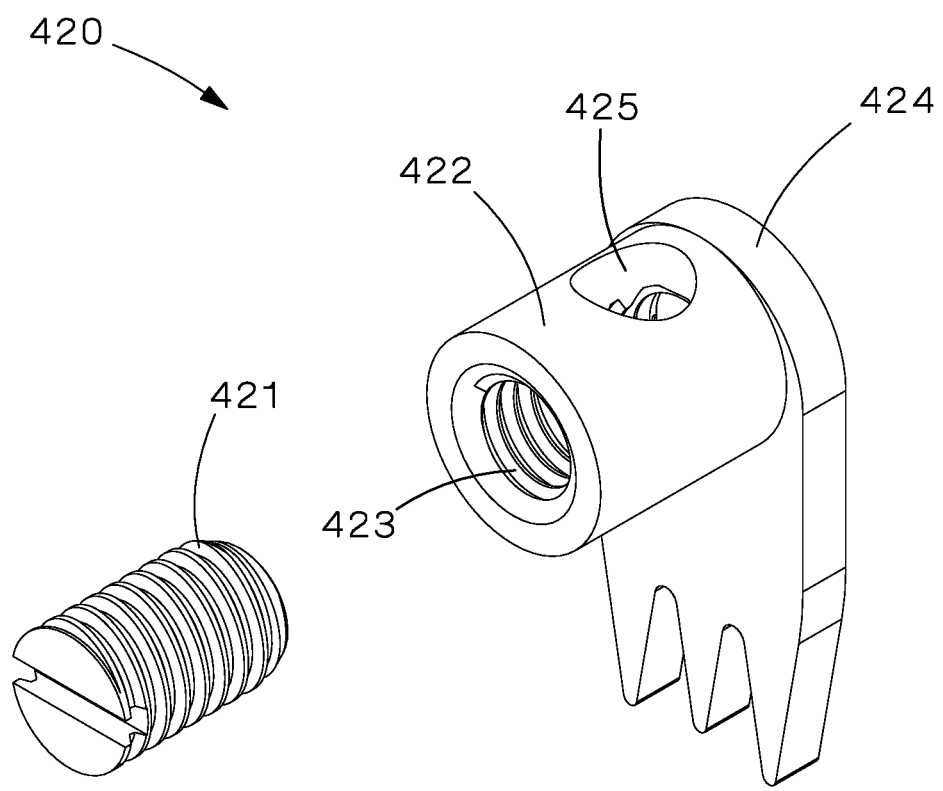
FIG. 26 shows a view of the integral screw-terminal contact shown in FIG. 25.

The single-piece design of the integrated HPC that combines the housing 422 and the piercing contact 424 reduces the number of unique components and the number of assembly steps to manufacture and field-use the insulation piercing connector 400. Although the integrated HPC is shown in FIG. 26 to have the housing 422 shaped into a cylindrical shape, alternative embodiments within the scope of this disclosure provide the housing 422 in different shapes and opening configurations. For example, FIGS. 27A to 27C show the integrated HPCs 610, 620, 630 including a housing portion with a cube shape.

Figure 27A:
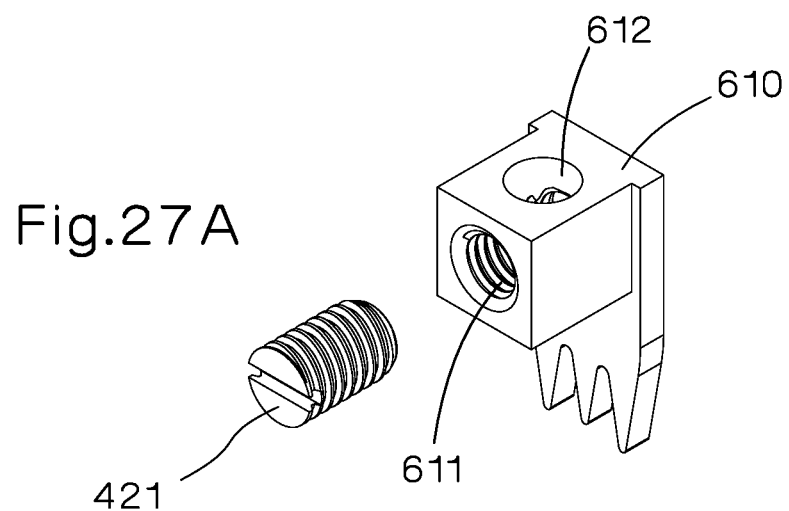
FIG. 27A shows an integral screw-terminal contact according to an alternative embodiment.

In FIG. 27A the integrated HPC 610 includes a fastener opening 611 for receiving the screw fastener 421 on a first surface of the housing portion that is opposite the piercing contact portion. FIG. 27A also shows the integrated HPC 610 including a space 612 for receiving the exposed conductor 494 of the tap wires 492 on a second surface (top) of the housing portion that is adjacent to the piercing contact portion.

Figure 27B:
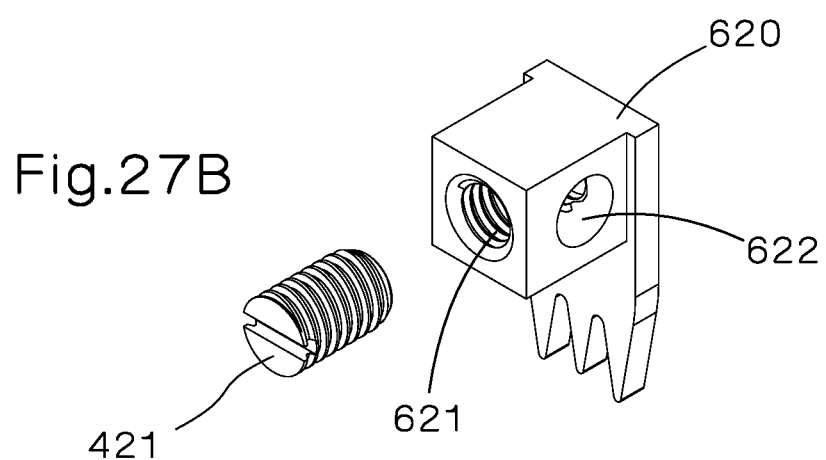
FIG. 27B shows an integral screw-terminal contact according to an alternative embodiment.

In FIG. 27B the integrated HPC 620 includes a fastener opening 621 for receiving the screw fastener 421 on the first surface of the housing portion that is opposite the piercing contact portion. FIG. 27B also shows the integrated HPC 620 including a space 622 for receiving the exposed conductor 494 of the tap wires 492 on a third surface (side) of the housing portion that is adjacent to the piercing contact portion.

Figure 27C:
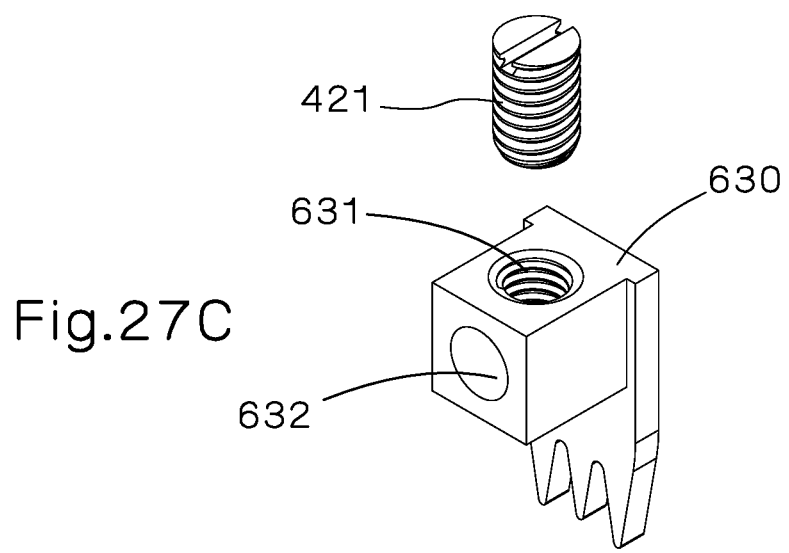
FIG. 27C shows an integral screw-terminal contact according to an alternative embodiment.

In FIG. 27C the integrated HPC 630 includes a fastener opening 631 for receiving the screw fastener 421 on the second surface of the housing portion that is adjacent to the piercing contact portion. FIG. 27C also shows the integrated HPC 630 including a space 632 for receiving the exposed conductor 494 of the tap wires 492 on the first surface of the housing portion that is opposite the piercing contact portion. In each of the integrated HPCs 610, 620, 630 having the cube shaped housing portions, the fastener opening may be located on a surface of the housing portion that is perpendicular to the space for receiving the exposed conductor 494 of the tap wires 492.

Although specific embodiments of the fasteners and connector components have been described, it is within the scope of the insulation piercing assemblies described in this disclosure to use alternative types of fasteners and connector components that serve the same functionality or result.

Note that while the present disclosure includes several embodiments, these embodiments are non-limiting, and there are alterations, permutations, and equivalents, which fall within the scope of this invention. Additionally, the described embodiments should not be interpreted as mutually exclusive and should instead be understood as potentially combinable if such combinations are permissive. It should also be noted that there are many alternative ways of implementing the embodiments of the present disclosure. It is therefore intended that claims that may follow be interpreted as including all such alterations, permutations, and equivalents as fall within the true spirit and scope of the present disclosure.

What is claimed is:

1. An insulation piercing connector, comprising:
   a top housing;
   a bottom housing, wherein the top housing and the bottom housing form a central aperture for holding a power cable; and
   an integrated contact assembly configured to be housed within the top housing in an assembled state, the integrated contact assembly configured to electrically couple a tap wire to the power cable, the integrated contact assembly comprising a boss housing and contact tines, wherein the boss housing includes an aperture for receiving the tap wire and a fastener opening for receiving an adjustment screw configured to contact the tap wire inside the boss housing, wherein the tap wire is configured to be routed through the top housing to couple with the integrated contact assembly within the top housing in the assembled state.

2. The insulation piercing connector of claim 1, further comprising:
   an inner insulator surrounding at least a portion of the contact tines while within the top housing when the insulation piercing connector is in the assembled state.

3. The insulation piercing connector of claim 1, wherein the central aperture is formed by a top portion of the bottom housing having a first concave portion and a bottom portion of the top housing having a second concave portion.

4. The insulation piercing connector of claim 1, wherein the boss housing is a cylindrical shape.

5. The insulation piercing connector of claim 1, wherein the boss housing is a cube shape.

6. The insulation piercing connector of claim 1, wherein the top housing includes a first opening and the bottom housing includes a second opening, wherein the first opening is configured to receive a carriage bolt that extends down through to the bottom housing where a hex nut is secured to an end of the carriage bolt at the bottom housing.

7. A method of installing an insulation piercing connector, the method comprising:
   inserting a tap wire through a top housing;
   securing the tap wire to an integrated contact assembly by:
      receiving the tap wire into an aperture of a boss housing included in the integrated contact assembly; and
      fastening an adjustment screw into a fastener opening of the integrated contact assembly to secure the tape wire within the aperture of the integrated contact assembly, wherein the integrated contact assembly is configured to be housed within the top housing in an assembled state;
   inserting a phase wire between the top housing and a bottom housing; and
   compressing the top housing and the bottom housing into the assembled state until a piercing contact of the integrated contact assembly pierces the phase wire.

8. The method of claim 7, wherein the top housing and the bottom housing form a central aperture.

9. The method of claim 7, wherein the boss housing is a cylindrical shape.

10. The method of claim 7, wherein the boss housing is a cube shape.

11. The method of claim 7, wherein the top housing includes a first opening and the bottom housing includes a second opening, wherein the first opening is configured to receive a carriage bolt that extends down through to the bottom housing where a hex nut is secured to an end of the carriage bolt at the bottom housing.

* * * * *